United States Patent
Lim et al.

(10) Patent No.: US 8,445,981 B2
(45) Date of Patent: May 21, 2013

(54) MAGNETIC MEMORY DEVICES, ELECTRONIC SYSTEMS AND MEMORY CARDS INCLUDING THE SAME, METHODS OF MANUFACTURING THE SAME, AND METHODS OF FORMING A PERPENDICULAR MAGNETIC FILM OF THE SAME

(75) Inventors: Woo Chang Lim, Hwasung (KR); Jangeun Lee, Suwon-si (KR); SeChung Oh, Suwon-si (KR); Woojin Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 13/177,115

(22) Filed: Jul. 6, 2011

(65) Prior Publication Data
US 2012/0018825 A1    Jan. 26, 2012

(30) Foreign Application Priority Data
Jul. 20, 2010    (KR) .................. 10-2010-0070118

(51) Int. Cl.
*H01L 29/82* (2006.01)
*H01L 21/00* (2006.01)

(52) U.S. Cl.
USPC ........................................ 257/422; 438/59

(58) Field of Classification Search
USPC .......... 257/295, 421–429, E21.436, E21.663; 365/158, 171; 438/48, 59–63
See application file for complete search history.

(56) References Cited

U.S. PATENT DOCUMENTS

| 6,602,621 B2* | 8/2003 | Matsunuma et al. ......... 428/827 |
| 7,098,495 B2 | 8/2006 | Sun et al. |
| 7,663,197 B2* | 2/2010 | Nagase et al. ................ 257/421 |
| 8,218,355 B2* | 7/2012 | Kitagawa et al. ............ 365/158 |
| 2002/0122959 A1 | 9/2002 | Matsunuma et al. |
| 2006/0017081 A1 | 1/2006 | Sun et al. |
| 2009/0243008 A1 | 10/2009 | Kitagawa et al. |

FOREIGN PATENT DOCUMENTS

| JP | 2004-006023 A | 1/2004 |
| JP | 2009-239120 A | 10/2009 |
| KR | 10-0545692 B1 | 1/2006 |
| KR | 2007-0035588 A | 3/2007 |
| KR | 2009-0103747 A | 10/2009 |

\* cited by examiner

*Primary Examiner* — Calvin Lee
(74) *Attorney, Agent, or Firm* — Harness, Dickey & Pierce, P.L.C.

(57) ABSTRACT

Magnetic memory devices, electronic systems and memory cards including the same, methods of manufacturing the same, and methods of forming perpendicular magnetic films are provided. The magnetic memory device may include a seed pattern on a substrate having a first crystal structure, a perpendicular magnetic pattern on the seed pattern having a second crystal structure, and an interlayer pattern between the seed pattern and the perpendicular magnetic pattern. The interlayer pattern may reduce a stress caused by a difference between horizontal lattice constants of the first and the second crystal structures.

48 Claims, 20 Drawing Sheets

NaCl Structure $L1_0$ Structure

MAGNETIC MEMORY DEVICES, ELECTRONIC SYSTEMS AND MEMORY CARDS INCLUDING THE SAME, METHODS OF MANUFACTURING THE SAME, AND METHODS OF FORMING A PERPENDICULAR MAGNETIC FILM OF THE SAME

CROSS-REFERENCE TO RELATED APPLICATIONS

This U.S. non-provisional patent application claims priority under 35 U.S.C. §119 of Korean Patent Application No. 10-2010-0070118, filed on Jul. 20, 2010, the entire contents of which are hereby incorporated by reference.

BACKGROUND

Example embodiments herein relate to semiconductor devices, and more particularly, to magnetic memory devices, electronic systems and memory cards including the same, methods of manufacturing the same, and methods of forming perpendicular magnetic films.

Recently, according to the desire to achieve higher speed and/or lower power electronic devices, demands for a higher speed operation and a lower operational voltage may be increasing in a semiconductor memory device which is a component part of the electronic devices. A magnetic memory device may be introduced as one of the semiconductor memory devices to meet such demands. Magnetic memory devices may be a next generation semiconductor memory device due to their higher-speed operation and/or nonvolatility.

In general, a magnetic memory device may include a magnetic tunnel junction (MTJ) pattern. A MTJ may include two magnetic substances and an insulation layer disposed between the two magnetic substances. A resistance value of the MTJ pattern may vary according to a magnetization direction of the two magnetic substances. For example, the resistance value of the MTJ may be large when the magnetization directions of the two magnetic substances are antiparallel. The resistance value of the MTJ may be small when the magnetization directions of the two magnetic substances are parallel. The difference in the resistance values enables writing and reading of data.

SUMMARY

Example embodiments of inventive concepts provide magnetic memory device having a higher reliability.

In example embodiments of inventive concepts, magnetic memory devices may include a seed pattern having a first crystal structure and on a substrate; a perpendicular magnetic pattern having a second crystal structure and on the seed pattern; and an interlayer pattern having a third crystal structure and between the seed pattern and the perpendicular magnetic pattern, wherein a horizontal lattice constant of the first crystal structure is different from a horizontal lattice constant of the first crystal structure, and the third crystal structure includes a horizontal lattice constant having a value between the horizontal lattice constant of the first crystal structure and the horizontal lattice constant of the second crystal structure.

In example embodiments, the seed pattern may include a conductive metal nitride having a sodium chloride (NaCl) structure, and the perpendicular magnetic pattern may include a magnetic material having an $L1_0$ structure.

In example embodiments, a (001) plane of the first crystal structure and a (001) plane of the second crystal structure may be substantially parallel with a top or major surface of the substrate.

In example embodiments, the third crystal structure of the interlayer pattern may be a distortion of an intrinsic crystal structure of a material included in the interlayer pattern.

In example embodiments, a top or major surface of the third crystal structure of the interlayer pattern may have a substantially square shape, and the top or major surface of the third crystal structure may include five lattice points corresponding to four vertices and a face center, respectively, of the top or major surface of the third crystal structure.

In example embodiments, the third crystal structure may include one of a face-centered cubic (FCC) structure, a fluorite structure, an $L1_0$ structure, or a perovskite structure.

In example embodiments, a bottom surface of the third crystal structure may have a substantially square shape, the bottom surface and the top or major surface of the third crystal structure may have different surface areas from each other, the horizontal lattice constant of the third crystal structure may be a horizontal lattice constant of the top or major surface of the third crystal structure, and a horizontal lattice constant of the bottom surface of the third crystal structure may have a value between the horizontal lattice constant of the first crystal structure and the horizontal lattice constant of the second crystal structure.

In example embodiments, the interlayer pattern may include a first sub pattern and a second sub pattern sequentially stacked, the first sub pattern may include the third crystal structure, the second sub pattern may include a fourth crystal structure, a top or major surface of the fourth crystal structure may have a substantially square shape and include five lattice points respectively corresponding to four vertices and a face center of the top or major surface of the fourth crystal structure, and a horizontal lattice constant of the top or major surface of the fourth crystal structure may have a value between the horizontal lattice constant of the third crystal structure and the horizontal lattice constant of the second crystal structure.

In example embodiments, the interlayer pattern may have a thickness of about 1 angstrom to about 10 angstroms.

In example embodiments, a magnetic easy axis of the perpendicular magnetic pattern is substantially perpendicular to a top or major surface of the substrate.

In example embodiments, the perpendicular magnetic pattern may correspond to a first perpendicular magnetic pattern. In example embodiments, the magnetic memory device may further include a tunnel barrier pattern on the first perpendicular magnetic pattern; and a second perpendicular magnetic pattern on the tunnel barrier pattern, wherein one of the first perpendicular magnetic pattern and the second perpendicular magnetic pattern is a reference layer having a fixed magnetization direction while the other is a free layer having a variable magnetization direction.

In example embodiments of inventive concepts, magnetic memory devices may include a seed pattern having a first crystal structure and on a substrate; a perpendicular magnetic pattern having a second crystal structure and on the seed pattern; and an interlayer pattern having a third crystal structure and between the seed pattern and the perpendicular magnetic pattern, wherein a horizontal lattice constant of the first crystal structure is different from a horizontal lattice constant of the first crystal structure, and a value obtained by multiplying a horizontal lattice constant of the third crystal structure by $\sqrt{2}$ is between the horizontal lattice constant of the first crystal structure and the horizontal lattice constant of the second crystal structure.

In example embodiments, a top or major surface of the third crystal structure may have a substantially square shape, and the top or major surface of the third crystal structure may include four lattice points at positions corresponding to four vertices of the top or major surface of the third crystal structure and no lattice point at a face center thereof.

In example embodiments, the third crystal structure may include one of a simple cubic (SC) structure, a body centered cubic (BCC) structure, a simple tetragonal (ST) structure, a body centered tetragonal (BCT) structure, or a cesium chloride (CsCl) structure.

In example embodiments, a [110] direction of the second crystal structure may be substantially parallel with a [100] direction of the third crystal structure.

In example embodiments, a bottom surface of the third crystal structure may have a substantially square shape, the bottom surface and the top or major surface of the third crystal structure may have different surface areas from each other, the horizontal lattice constant of the third crystal structure may be equal to a horizontal lattice constant of the top or major surface of the third crystal structure, and a value obtained by multiplying a horizontal lattice constant of the bottom surface of the third crystal structure by $\sqrt{2}$ may be between the horizontal lattice constant of the first crystal structure and the horizontal lattice constant of the second crystal structure.

In example embodiments, the interlayer pattern may include a first sub pattern and a second sub pattern sequentially stacked, the first sub pattern may include the third crystal structure, the second sub pattern may include a fourth crystal structure, a top or major surface of the fourth crystal structure may have a substantially square shape, the top or major surface of the fourth crystal structure may include four lattice points at positions corresponding to four vertices of the top or major surface of the fourth crystal structure and no lattice point at a face center thereof, and a value obtained by multiplying a horizontal lattice constant of the top or major surface of the fourth crystal structure by $\sqrt{2}$ may be between a value obtained by multiplying a horizontal lattice constant of the top or major surface of the third crystal structure by $\sqrt{2}$, and the horizontal lattice constant of the second crystal structure.

In example embodiments of inventive concepts, a magnetic memory device may include a seed pattern on a substrate with a first atomic plane parallel to a major surface of the substrate, the seed pattern having a first crystal structure and including a nitride, an interlayer pattern on the seed pattern with the same atomic plane parallel to the first atomic plane of the seed pattern and parallel to the major surface of the substrate, the interlayer pattern having a second crystal structure, and a perpendicular magnetic pattern on the interlayer pattern with the same atomic plane parallel to the first atomic plane of the seed pattern and to the major surface of the substrate, the perpendicular magnetic pattern having a third crystal structure, wherein a horizontal lattice constant of the first crystal structure is different from a horizontal lattice constant of the third crystal structure and the second crystal structure includes a horizontal lattice constant having a value between the horizontal lattice constant of the first crystal structure and the horizontal lattice constant of the third crystal structure.

In example embodiments, the first atomic plane is a (001) plane.

In example embodiments, the seed pattern, the interlayer pattern, and the perpendicular magnetic pattern are grown in a [001] direction to form a magnetic layer of a perpendicular magnetic tunnel junction.

In example embodiments, the [001] direction is parallel to a magnetic easy direction of the perpendicular magnetic tunnel junction.

In example embodiments, the seed pattern includes a conductive metal nitride.

In example embodiments, the nitride is at least one of titanium nitride (TiN), tantalum nitride (TaN), chrome nitride (CrN), or vanadium nitride (VN).

In example embodiments, the seed pattern has a sodium chloride (NaCl) structure.

In example embodiments, the interlayer pattern includes at least one of tantalum (Ta), chromium (Cr), platinum (Pt), palladium (Pd), titanium (Ti), ruthenium (Ru), magnesium (Mg), or compounds thereof.

In example embodiments, the interlayer pattern further includes at least one metal, oxygen (O), or hydrogen (H).

In example embodiments, the interlayer pattern is one of a single-element, two-element, or three-element material.

In example embodiments, the single-element material has a face centered cubic (FCC) structure.

In example embodiments, the two-element material has one of a flourite and an $L1_0$ structure.

In example embodiments, the three-element material has a perovskite structure.

In example embodiments, the perpendicular magnetic pattern includes platinum.

In example embodiments, the perpendicular magnetic pattern includes at least one of $Fe_{50}Pt_{50}$, $Fe_{50}Pd_{50}$, $Co_{50}Pd_{50}$, or $Co_{50}Pt_{50}$.

In example embodiments, the perpendicular magnetic pattern further includes additive materials for improving a degree of crystalline ordering of the perpendicular magnetic pattern.

In example embodiments, the additive materials include at least one of a non-magnetic element, oxide of the non-magnetic element, nitride of the non-magnetic element, silicon oxide, aluminum oxide, or magnesium (Mg) oxide.

In example embodiments, the non-magnetic element includes at least one of boron (B), carbon (C), copper (Cu), silver (Ag), gold (Au), and chromium (Cr).

In example embodiments, the perpendicular magnetic pattern has an $L1_0$ structure.

In example embodiments, the second crystal structure of the interlayer pattern is a distortion of an intrinsic crystal structure of a material comprised in the interlayer pattern.

In example embodiments, a major surface of the second crystal structure of the interlayer pattern has a substantially square shape and the major surface of the second crystal structure includes five lattice points corresponding to four vertices and a face center, respectively, of the major surface of the second crystal structure.

In example embodiments, a bottom surface of the second crystal structure has a substantially square shape, the bottom surface and the major surface of the second crystal structure have different surface areas from each other, the horizontal lattice constant of the second crystal structure is a horizontal lattice constant of the major surface of the second crystal structure, and a horizontal lattice constant of the bottom surface of the second crystal structure has a value between the horizontal lattice constant of the first crystal structure and the horizontal lattice constant of the third crystal structure.

In example embodiments, the interlayer pattern includes a first sub pattern and a second sub pattern sequentially stacked, the first sub pattern has the second crystal structure, the second sub pattern has a fourth crystal structure, a major surface of the fourth crystal structure has a substantially square shape and include five lattice points corresponding to four vertices and a face center of the major surface of the fourth crystal structure, and a horizontal lattice constant of the major surface of the fourth crystal structure has a value between the horizontal lattice constant of the third crystal structure and the horizontal lattice constant of the second crystal structure.

In example embodiments, a magnetic easy axis of the perpendicular magnetic pattern is substantially perpendicular to a major surface of the substrate.

In example embodiments, the perpendicular magnetic pattern corresponds to a first perpendicular magnetic pattern, the magnetic memory device may further include a tunnel barrier pattern on the first perpendicular magnetic pattern and a second perpendicular magnetic pattern on the tunnel barrier pattern, wherein one of the first perpendicular magnetic pattern and the second perpendicular magnetic pattern is a reference layer having a fixed magnetization direction and the other is a free layer having a variable magnetization direction.

In example embodiments, a value obtained by multiplying a horizontal lattice constant of the second crystal structure by $\sqrt{2}$ is between the horizontal lattice constant of the first crystal structure and the horizontal lattice constant of the third crystal structure.

In example embodiments, the interlayer pattern includes at least one of ruthenium (Ru), magnesium (Mg), titanium (Ti) or compounds thereof.

In example embodiments, the second crystal structure is one of a simple cubic (SC) structure, a body centered cubic (BCC) structure, a simple tetragonal (ST) structure, a body centered tetragonal (BCT) structure, or a cesium chloride (CsCl) structure.

In example embodiments, a [100] direction of the second crystal structure is substantially parallel with a [110] direction of the third crystal structure.

In example embodiments, a bottom surface of the second crystal structure has a substantially square shape, the bottom surface and the major surface of the second crystal structure have different surface areas from each other, the horizontal lattice constant of the second crystal structure is a horizontal lattice constant of the major surface of the third crystal structure, and a value obtained by multiplying a horizontal lattice constant of the bottom surface of the third crystal structure by $\sqrt{2}$ is between the horizontal lattice constant of the first crystal structure and the horizontal lattice constant of the third crystal structure.

In example embodiments of inventive concepts an electronic system may include an input/output device, connected to a bus, configured to receive and send data externally, an interface, connected to the bus, configured to transmit data to and receive data from a communications network, a controller, connected to the bus, configured to process commands, and a magnetic memory device according to example embodiments of inventive concepts, connected to the bus, configured to store and retrieve data.

In example embodiments of inventive concepts, a memory card may include a magnetic memory device according to according to example embodiments of inventive concepts, connected to a bus, configured to store and retrieve data, and a controller including a processing unit connected to the bus, configured to control general operations of the memory card, a RAM, connected to the bus, configured as an operating memory of the processing unit, a host interface connected to the bus, configured to implement a data exchange protocol between the memory card and a host, a memory interface connected to the bus, configured to connect the memory controller with the memory device, and an error correction block connected to the bus, configured to detect and correct errors of data read from the magnetic memory device.

In example embodiments of inventive concepts, a method of forming a first perpendicular magnetic film may include forming a seed film on a substrate with a first atomic plane parallel to a major surface of the substrate, the seed film having a first crystal structure and including a nitride, forming an interlayer film on the seed film with the same atomic plane parallel to the first atomic plane of the seed film and parallel to the major surface of the substrate, the interlayer film having a second crystal structure, and forming the first perpendicular magnetic film on the interlayer film with the same atomic plane parallel to the first atomic plane of the seed film and to the major surface of the substrate, the first perpendicular magnetic film having a third crystal structure using the seed film as a seed for growth of the first perpendicular magnetic film, wherein a horizontal lattice constant of the first crystal structure is different from a horizontal lattice constant of the third crystal structure, and the second crystal structure includes a horizontal lattice constant having a value between the horizontal lattice constant of the first crystal structure and the horizontal lattice constant of the third crystal structure.

In example embodiments of inventive concepts, a method of forming a magnetic memory device may include forming a dielectric layer on the substrate between the seed film and the substrate, forming a first perpendicular magnetic film according to example embodiments of inventive concepts, forming a first polarization enhanced film on the first perpendicular magnetic film, forming a tunnel barrier film on the first polarization enhanced film, forming a second polarization enhanced film on the tunnel barrier film, forming a second perpendicular magnetic film on the second polarization enhanced film, forming a capping electrode film on the second perpendicular magnetic film, and patterning the capping electrode film, the second perpendicular magnetic film, the second polarization enhanced film, the tunnel barrier film, the first polarization enhanced film, the first perpendicular magnetic film, the interlayer film, and the seed film to form a capping electrode, a second perpendicular magnetic pattern, a second polarization enhanced pattern, a tunnel barrier pattern, a first polarization enhanced pattern, a first perpendicular magnetic pattern, an interlayer pattern, and a seed pattern, respectively, of the magnetic memory device.

In example embodiments, forming the second polarization enhanced film includes repeatedly forming first layers and second layers of different materials.

In example embodiments, the magnetic memory device includes a magnetic tunnel junction (MTJ), wherein the first perpendicular magnetic pattern is a free layer and the second perpendicular magnetic pattern is a reference layer of the MTJ.

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings.

DETAILED DESCRIPTION OF EXAMPLE EMBODIMENTS

Figure 1:
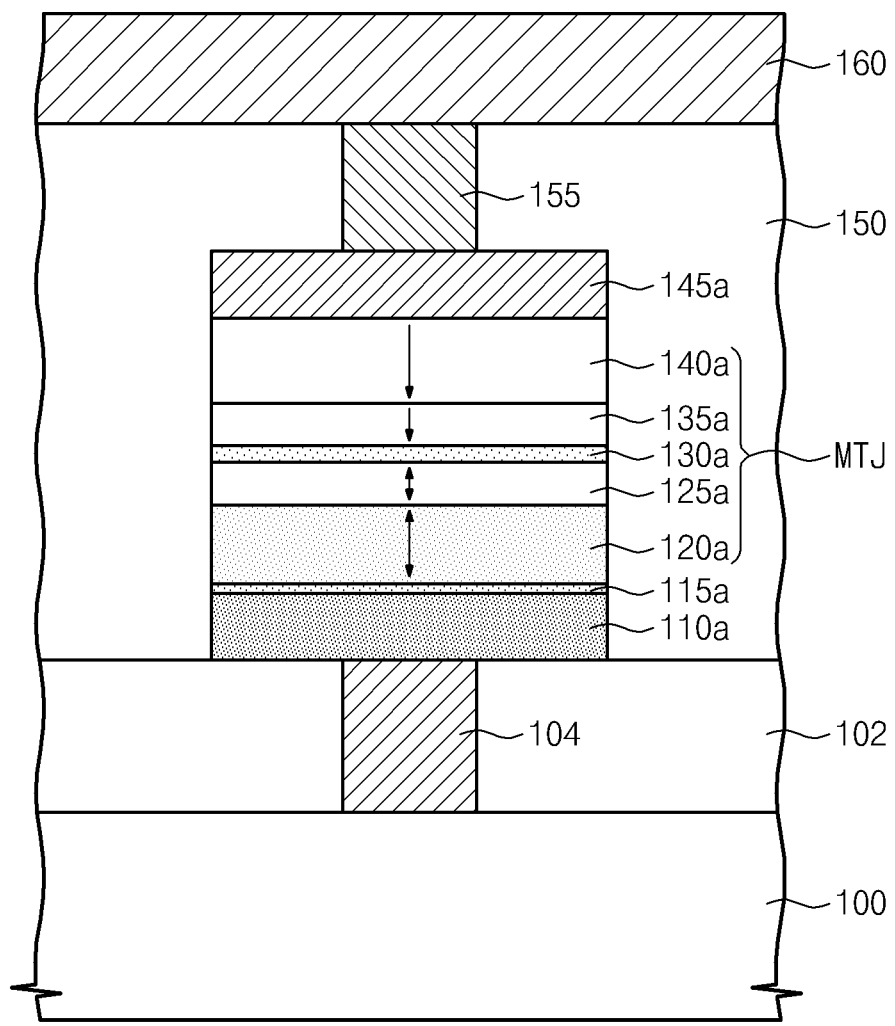
FIG. 1 is a sectional view of a magnetic memory device according to embodiments of inventive concepts.

Example embodiments of inventive concepts will be described below in more detail with reference to the accompanying drawings. The inventive concepts may, however, be embodied in different forms and should not be construed as limited to example embodiments set forth herein. Rather, these example embodiments are provided so that this disclosure will be thorough and complete, and will fully convey the scope of the inventive concepts to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

FIG. 1 is a sectional view showing a magnetic memory device according to example embodiments of inventive concepts.

Referring to FIG. 1, a first dielectric layer 102 may be disposed on a substrate 100. A lower contact plug 104 may be formed through the first dielectric layer 102. A bottom surface of the lower contact plug 104 may be electrically connected with a terminal of a switching element such as a metal oxide semiconductor (MOS) transistor and a diode. The first dielectric layer 102 may be made of at least one of an oxide, a nitride, and an oxynitride. The lower contact plug 104 may be made of a conductive material. For example, the lower contact plug 104 may include at least one of a dopant-doped semiconductor (for example, doped silicon (Si), doped germanium (Ge), and doped Si—Ge), a metal (for example, titanium (Ti), a tantalum (Ta), and tungsten (W)), or a conductive metal nitride (for example, TiN and TaN).

A seed pattern 110a, an interlayer pattern 115a, a first perpendicular magnetic pattern 120a, a tunnel barrier pattern 130a, and a second perpendicular magnetic pattern 140a may be sequentially stacked on the first dielectric layer 102. The seed pattern 110a may be electrically connected to a top or major surface of the lower contact plug 104. The first perpendicular magnetic pattern 120a, the tunnel barrier pattern 130a, and the second perpendicular magnetic pattern 140a may constitute a magnetic tunnel junction (MTJ) pattern. In addition, the MTJ pattern may further include a first polarization enhanced pattern 125a disposed between the first perpendicular magnetic pattern 120a and the tunnel barrier pattern 130a, and a second polarization enhanced pattern 135a disposed between the tunnel barrier pattern 130a and the second perpendicular magnetic pattern 140a. A capping electrode 145a may be disposed on the second perpendicular magnetic pattern 140a. Sidewalls of the seed pattern 110a, the interlayer pattern 115a, the MTJ pattern, and the capping electrode 145a may be all aligned with one another.

The first perpendicular magnetic pattern 120a may have a magnetic easy direction or magnetic easy axis substantially perpendicular to a top or major surface of the substrate 100. Accordingly, a magnetization direction of the first perpendicular magnetic pattern 120a may be substantially perpendicular to the top surface of the substrate 100. In the same manner, the second perpendicular magnetic pattern 140a may also have a magnetic easy axis substantially perpendicular to the top or major surface of the substrate 100. One of the first and the second perpendicular magnetic patterns 120a and 140a may serve as a reference layer having a fixed magnetization direction and the other may serve as a free layer having a variable magnetization direction. The magnetization direction of the free layer may be changeable to be parallel with or antiparallel to the magnetization direction of the reference layer. According to example embodiments, as shown in FIG. 1, the first perpendicular magnetic pattern 120a may be the free layer while the second perpendicular magnetic pattern 140a may be the reference layer. In example embodiments, the magnetization direction of the second perpendicular magnetic pattern 140a may be substantially perpendicular to the top or major surface of the substrate 100 and fixed in one direction. On the other hand, the magnetization direction of the first perpendicular magnetic pattern 120a may be changeable to be parallel with or antiparallel to the magnetization direction of the second perpendicular magnetic pattern 140a according to a programmed operation. However, inventive concepts are not limited thereto. That is, the first perpendicular magnetic pattern 120a may be the reference layer while the second perpendicular magnetic pattern 140a may be the free layer.

The seed pattern 110a may have a first crystal structure. The first perpendicular magnetic pattern 120a may have a second crystal structure. According to example embodiments, the first perpendicular magnetic pattern 120a may include a magnetic material having an $L1_0$ structure so that the magnetic easy axis of the first perpendicular magnetic pattern 120a is substantially perpendicular to the top surface of the substrate 100. The $L1_0$ structure denotes one of the crystal structures in accordance with the Strukturbericht designation. The seed pattern 110a may function as a seed for growth of the first perpendicular magnetic pattern 120a. For example, the seed pattern 110a may substantially function as a seed for growth of the first perpendicular magnetic pattern 120a in a [001] direction. In addition, the seed pattern 110a may include a conductive material having a sufficient or excellent barrier property. According to example embodiments, the seed pattern 110a may include a conductive metal nitride having a sodium chloride (NaCl) structure. The NaCl structure of the conductive metal nitride may correspond to the first crystal structure of the seed pattern 110a. The $L1_0$ structure of the magnetic material may correspond to the second crystal structure of the first perpendicular magnetic pattern 120a. The seed pattern 110a and the first perpendicular magnetic pattern 120a will be more specifically described with reference to the crystal structures shown in FIGS. 2 and 3.

Figure 2:
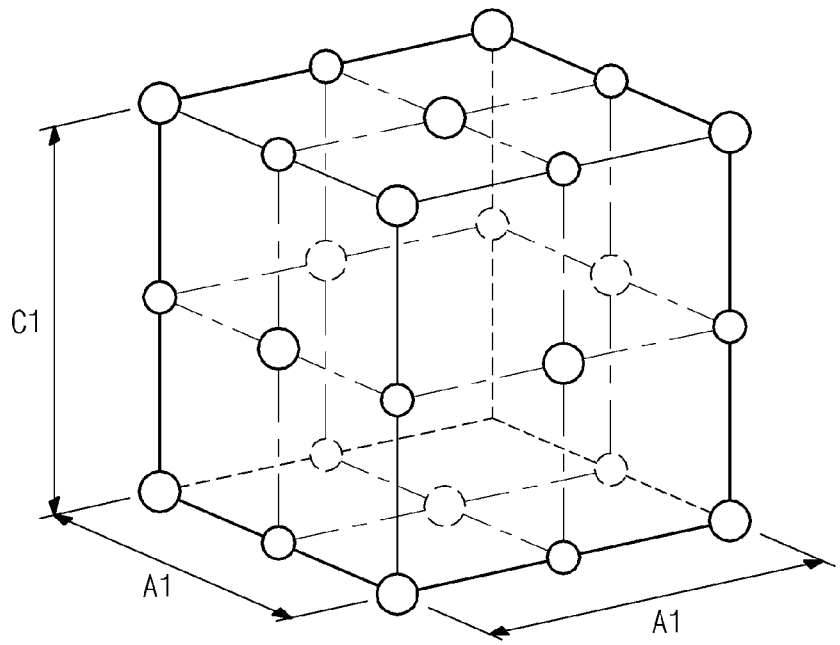
FIG. 2 is a view explaining a crystal structure of a seed pattern according to example embodiments.

FIG. 2 is a view for explaining the crystal structure of the seed pattern according to example embodiments of inventive concepts.

Referring to FIGS. 1 and 2, the NaCl structure may include two horizontal axes forming a square plane and a perpendicular axis perpendicular to the horizontal axes. Lengths of the two horizontal axes (that is, horizontal lattice constants) of the NaCl structure are equal to each other. Each of the horizontal axes of the NaCl structure has a first horizontal lattice constant A1. The perpendicular axis of the NaCl structure has a first perpendicular lattice constant C1. The first horizontal lattice constant A1 of the NaCl structure may be equal to the first perpendicular lattice constant C1 of the NaCl structure. Accordingly, the NaCl structure may have a regular hexahedron shape.

A (001) plane of the NaCl structure of the seed pattern 110a may be substantially parallel with the top or major surface of the substrate 100. Therefore, the seed pattern 110a may substantially function as a seed for the growth of the $L1_0$ structure of the first perpendicular magnetic pattern 120a in the [001] direction. The seed pattern 110a may include a conductive metal nitride having the NaCl structure. For example, the seed pattern 110a may include at least one of titanium nitride (TiN), tantalum nitride (TaN), chrome nitride (CrN), or vanadium nitride (VN). The seed pattern 110a may be in a crystalline state by having the NaCl structure. According to example embodiments, the seed pattern 110a may be in a polycrystalline state.

Figure 3:
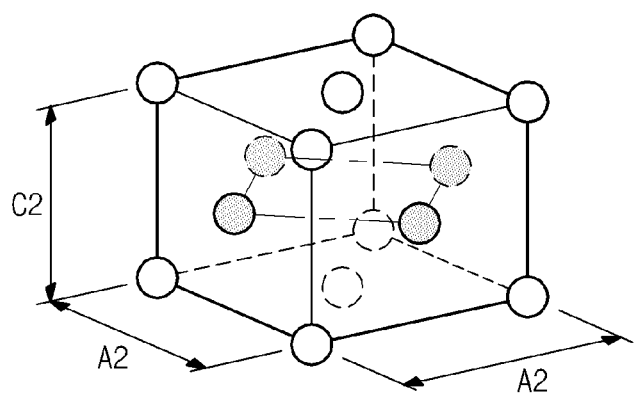
FIG. 3 is a view explaining a crystal structure of a first perpendicular magnetic pattern according to example embodiments.

FIG. 3 is a view for explaining the crystal structure of the first perpendicular magnetic pattern according to example embodiments of inventive concepts.

Referring to FIGS. 1 and 3, as described above, the first perpendicular magnetic pattern 120a may include the magnetic material having the $L1_0$ structure. The $L1_0$ structure of the first perpendicular magnetic pattern 120a may include two horizontal axes forming a square plane, and a single perpendicular axis perpendicular to the horizontal axes. The two horizontal axes of the $L1_0$ structure of the first perpendicular magnetic pattern 120a have the same horizontal lattice constant as each other. Each of horizontal axes of the $L1_0$ structure included in the first perpendicular magnetic pattern 120a has a second horizontal lattice constant A2. The perpendicular axis of the $L1_0$ structure included in the first perpendicular magnetic pattern 120a has a second perpendicular lattice constant C2. The second perpendicular lattice constant C2 may be different from the second horizontal lattice constant A2. Accordingly, the $L1_0$ structure of the first perpendicular magnetic pattern 120a may have a tetragonally distorted form of a face centered cubic (FCC) structure. The $L1_0$ structure of the first perpendicular magnetic pattern 120a may include two types of atoms. A (001) plane of the $L1_0$ structure of the first perpendicular magnetic pattern 120a may be substantially parallel with the top or major surface of the substrate 100 so that the magnetic easy axis of the first perpendicular magnetic pattern 120a is substantially perpendicular to the top or major surface of the substrate 100. As shown in FIG. 3, the (001) plane of the $L1_0$ structure of the first perpendicular magnetic pattern 120a has five lattice points. For example, the magnetic material having the $L1_0$ structure included in the first perpendicular magnetic pattern 120a may include at least one of Fe50Pt50, Fe50Pd50, Co50Pd50, or Co50Pt50. In addition, the first perpendicular magnetic pattern 120a may further include additive materials for improving a degree of crystalline ordering of the magnetic material having the $L1_0$ structure. For example, the additive material of the first perpendicular magnetic pattern 120a may include at least one of a non-magnetic element, oxide of a non-magnetic element, nitride of a non-magnetic element, silicon oxide, aluminum oxide, of magnesium (Mg) oxide. The non-magnetic element may be at least one of boron (B), carbon (C), copper (Cu), silver (Ag), gold (Au), and chromium (Cr). The first perpendicular magnetic pattern 120a may include a small quantity of the additive materials.

Referring to FIGS. 1, 2, and 3, since the (001) plane of the NaCl structure of the seed pattern 110a is substantially parallel with the top surface of the substrate 100, the $L1_0$ structure of the first perpendicular magnetic pattern 120a may be able to grow substantially in the [001] direction. Also, since the (001) plane of the $L1_0$ structure of the first perpendicular magnetic pattern 120a is substantially parallel with the top surface of the substrate 100, the magnetic easy axis of the first perpendicular magnetic pattern 120a may be able to grow substantially perpendicular to the top surface of the substrate 100. The five lattice points of the (001) plane of the perpendicular magnetic pattern 120a may correspond to lattice points disposed at four vertices and at a face center of the (001) plane of the seed pattern 110a.

The first horizontal lattice constant A1 of the seed pattern 110a may be different from the second horizontal lattice constant A2 of the first perpendicular magnetic pattern 120a. A difference between the first and second horizontal lattice constants A1 and A2 may cause a stress between the seed pattern 110a and the first perpendicular magnetic pattern 120a. The interlayer pattern 115a between the seed pattern 110a and the first perpendicular magnetic pattern 120a is capable of reducing the stress caused by the difference between the first and second horizontal lattice constants A1 and A2. As a result, reduction in the reliability of the magnetic memory device due to the stress may be reduced or minimized. According to example embodiments, since the first and the second horizontal lattice constants A1 and A2 are different from each other, the seed pattern 110a may apply a first stress to a bottom surface of the interlayer pattern 115a in a horizontal direction. Also, the first perpendicular magnetic pattern 120a may apply a second stress to a top or major surface of the interlayer pattern 115a in the horizontal direction. One of the first stress and the second stress may be a tensile force while the other one is a compressive force. For example, as shown in FIGS. 2 and 3, in case that the first horizontal lattice constant A1 may be greater than the second horizontal lattice constant A2, the seed pattern 110a may apply the tensile force to the bottom surface of the interlayer pattern 115a and the first perpendicular magnetic pattern 120a may apply the compressive force to the top or major surface of the interlayer pattern 115a. According to example embodiments, the first horizontal lattice constant A1 may be smaller than the second horizontal lattice constant A2. In example embodiments, the seed pattern 110a may apply the compressive force to the bottom surface of the interlayer pattern 115a while the first perpendicular magnetic pattern 120a applies the tensile force to the top or major surface of the interlayer pattern 115a.

According to example embodiments, the interlayer pattern 115a may have a very small thickness so that the seed pattern 110a is able to substantially function as the seed for the first perpendicular magnetic pattern 120a. For example, the thickness of the interlayer pattern 115a may be about 1 angstrom to about 10 angstroms.

According to example embodiments, the interlayer pattern 115a may include at least one of tantalum (Ta), chromium (Cr), platinum (Pt), palladium (Pd), titanium (Ti), ruthenium (Ru), magnesium (Mg), or compounds thereof. The compounds may further include other elements such as metals (for example, Al), oxygen (O), or hydrogen (H).

According to example embodiments, the interlayer pattern 115a may have a third crystal structure. The third crystal structure according to one embodiment will now be explained with reference to FIGS. 4A through 4E.

Figure 4A:
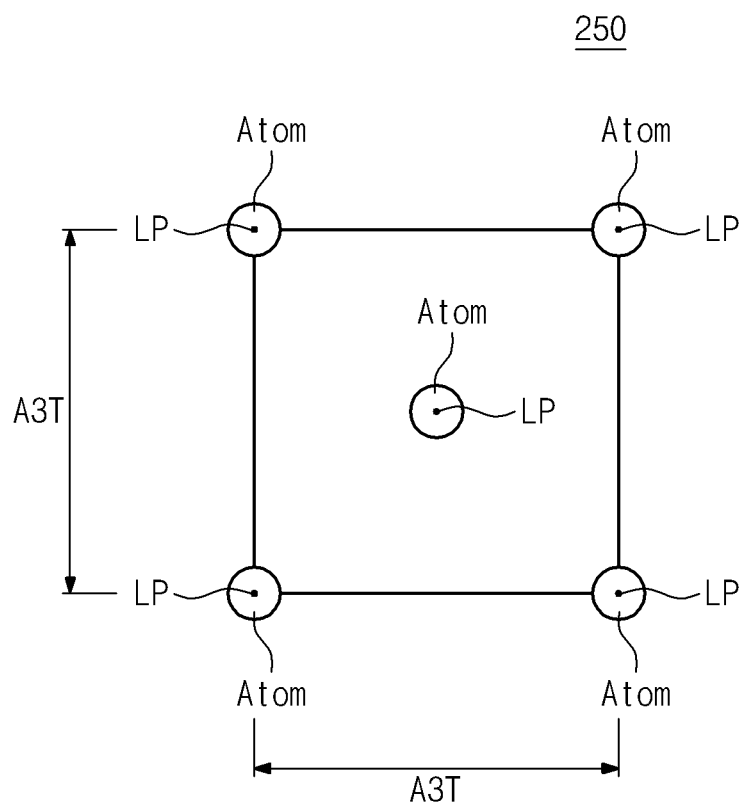
FIG. 4A is a plan view explaining a crystal structure of an interlayer pattern in the magnetic memory device of FIG. 1, according to example embodiments of inventive concepts.

FIG. 4A is a plan view explaining a crystal structure of an interlayer pattern in the magnetic memory device of FIG. 1, according to example embodiments of inventive concepts.

Referring to FIGS. 1 and 4A, the third crystal structure of the interlayer pattern 115a may include a top or major surface 250 having a substantially square shape. FIG. 4A is a plan view showing the top surface 250 of the third crystal structure of the interlayer pattern 115a according to example embodiments. The top surface 250 of the third crystal structure may correspond to a (001) plane of the third crystal structure. As shown in FIG. 4A, the top surface 250 may include five lattice points LP. The five lattice points LP of the top surface 250 may correspond to four vertices and a face center of the top surface 250, respectively. Atoms may be disposed at each of the five lattice points LP. The top surface 250 of the third crystal structure may be substantially parallel with the top surface of the substrate 100. The five lattice points LP of the top surface 250 of the third crystal structure may correspond to the lattice points of the (001) plane of the $L1_0$ structure of the first perpendicular magnetic pattern 120a. The atoms disposed at the five lattice points LP of the top surface 250 may be all of the same kind. The atoms disposed at the five lattice points LP of the top surface 250 may be divided into two different kinds. The top surface 250 of the third crystal structure includes two horizontal axes and each of the horizontal axes of the top surface 250 has a third horizontal lattice constant A3T.

Referring to FIGS. 1, 2, 3, and 4A, the third horizontal lattice constant A3T of the third crystal structure may be a value between the first horizontal lattice constant A1 of the seed pattern 110a and the second horizontal lattice constant A2 of the first perpendicular magnetic pattern 120a. Accordingly, the stress caused by the difference between the first and the second horizontal lattice constants A1 and A2 may be reduced by the interlayer pattern 115a including the third crystal structure. In example embodiments that the first horizontal lattice constant A1 is greater than the second horizontal lattice constant A2, the third horizontal lattice constant A3T may be smaller than the first horizontal lattice constant A1 and greater than the second horizontal lattice constant A2. Alternatively, in example embodiments where the first horizontal lattice constant A1 is smaller than the second horizontal lattice constant A2, the third horizontal lattice constant A3T may be greater than the first horizontal lattice constant A1 and smaller than the second horizontal lattice constant A2.

Figure 4B:
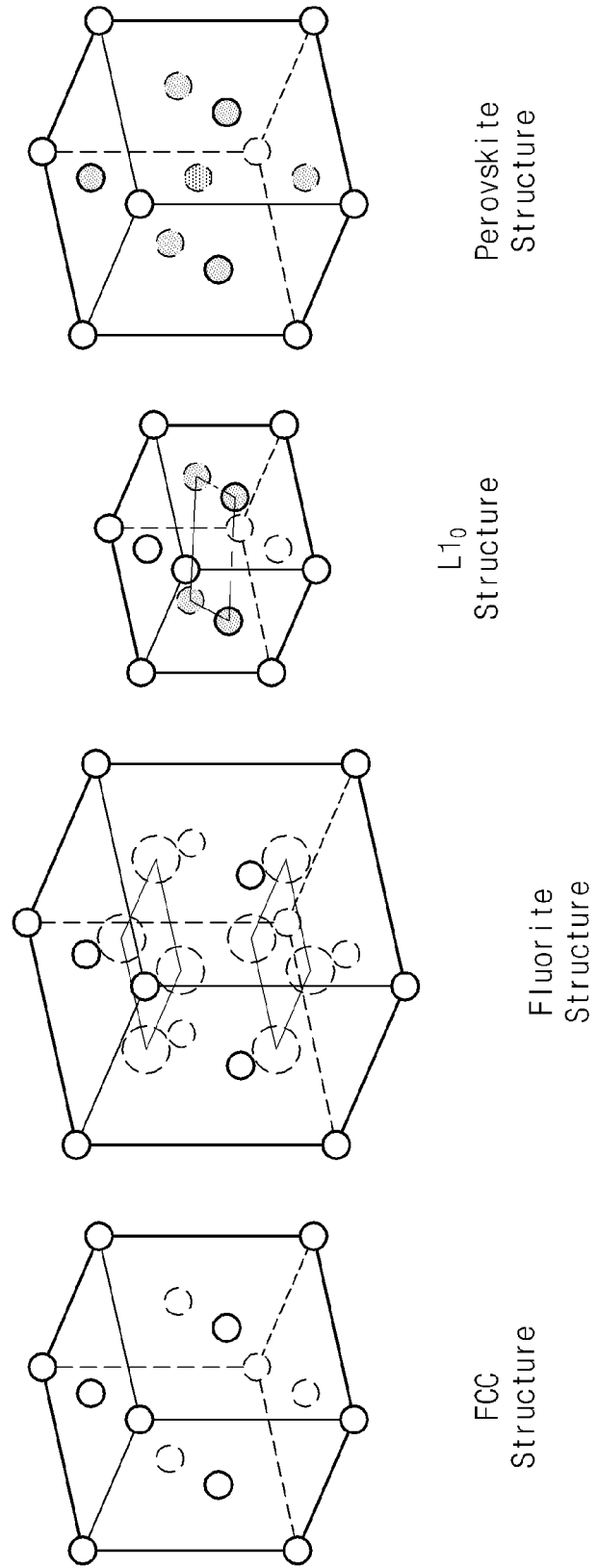
FIG. 4B is a view showing example embodiments of the crystal structure of the interlayer pattern shown in FIG. 4A.

FIG. 4B is a view showing example embodiments of the crystal structure of the interlayer pattern shown in FIG. 4A.

Referring to FIGS. 1, 4A, and 4B, according to example embodiments, the third crystal structure of the interlayer pattern 115a may be one of a face centered cubic structure (FCC structure), a fluorite structure, the $L1_0$ structure, or a perovskite structure. For example, in example embodiments where the interlayer pattern 115a may include a single element material, the third crystal structure of the interlayer pattern 115a may be the FCC structure. For example, the interlayer pattern 115a may include the FCC structure including Pt or the FCC structure including Pd. Alternatively, in example embodiments where the interlayer pattern 115a may include a two-element material, the third crystal structure of the interlayer pattern 115a may be the fluorite structure or the $L1_0$ structure. For example, the interlayer pattern 115a may include the fluorite structure including H and Cr, the $L1_0$ structure including Pt and other elements, or the $L1_0$ structure including Pd and other elements. Still alternatively, in a case where the interlayer pattern 115a may include a three-element material, the interlayer pattern 115a may include the perovskite structure. For example, the interlayer pattern 115a may include the perovskite structure including Ti, strontium (Sr), and O.

According to example embodiments, the third crystal structure of the interlayer pattern 115a may be a distortion of an intrinsic crystal structure of a material included in the interlayer pattern 115a, distorted by the seed pattern 110a and the first perpendicular magnetic pattern 120a. The intrinsic crystal structure may be distorted due to the stress by the difference between the first and the second horizontal lattice constants A1 and A2. Furthermore, since the interlayer pattern 115a has the small thickness of about 1 to about 10 angstroms, the intrinsic crystal structure may be distorted by the difference between the first and the second horizontal lattice constants A1 and A2. For example, Ru atoms, Ti atoms, or Mg atoms may be arranged corresponding to the five Lattice Points LP of the top surface 250 of the third crystal structure. The intrinsic crystal structures of Ru, Ti, and Mg may be a hexagonal close-packing structure. However, the intrinsic crystal structure may be distorted due to the difference between the first and the second lattice constants A1 and A2, such that the third crystal structure having Ru, Ti or Mg may include a top or major surface 250 having substantially square shape shown in FIG. 4A. For example, the third crystal structure may be one of the FCC structure which has one of Ru, Ti or Mg, the fluorite structure which has one of Ru, Ti or Mg, the $L1_0$ structure which has Ru, Ti, or Mg, or the perovskite structure which has one of Ru, Ti or Mg.

Figure 4C:
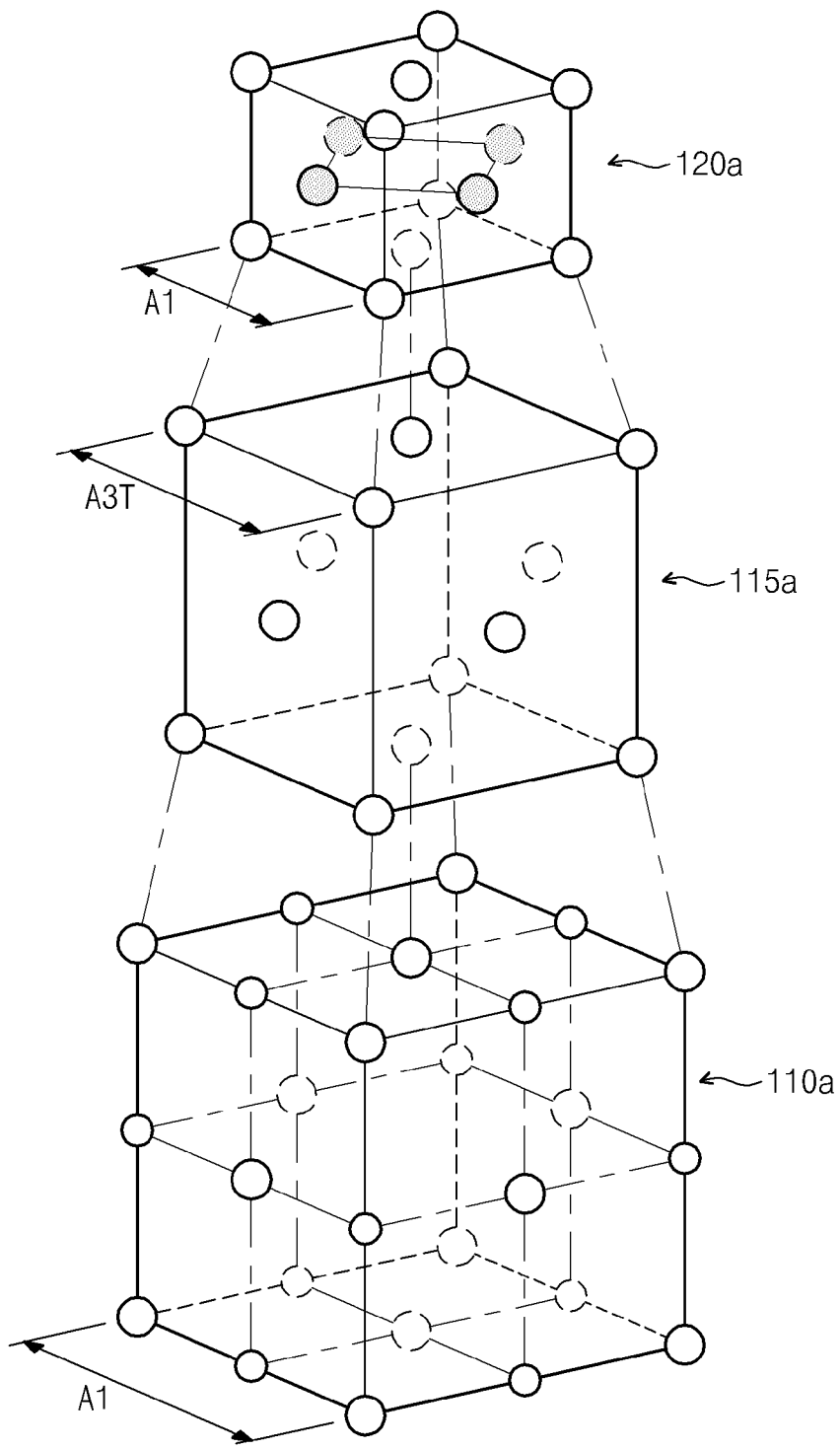
FIG. 4C is a view showing crystal structures of the first perpendicular magnetic pattern and the seed pattern and the crystal structure of the interlayer pattern shown in FIG. 4B.

FIG. 4C shows the crystal structures of the first perpendicular magnetic pattern and the seed pattern and the crystal structure of interlayer pattern of FIG. 4B.

Referring to FIGS. 1 and 4C, the third crystal structure of the interlayer pattern 115a may be disposed between the NaCl structure of the seed pattern 110a and the $L1_0$ structure of the first perpendicular magnetic pattern 120a. Although FIG. 4C shows an example where the third crystal structure of the interlayer pattern 115a is the FCC structure shown in FIG. 4B, for convenience of explanation, inventive concepts are not limited to example embodiments. Therefore, the interlayer pattern 115a may include one of the fluorite structure, the $L1_0$ structure, and the perovskite structure. Also, the interlayer pattern 115a includes a single third crystal structure according to FIG. 4C for convenience of explanation. However, inventive concepts are not limited thereto. That is, the interlayer pattern 115a may include a plurality of the third crystal structures sequentially stacked.

As shown in FIG. 4C, the (001) plane of the seed pattern 110a, the (001) plane of the interlayer pattern 115a, and the (001) plane of the first perpendicular magnetic pattern 120a may be parallel with one another. In example embodiments, the (110) plane of the seed pattern 110a, the (110) plane of the interlayer pattern 115a, and the (110) plane of the first perpendicular magnetic pattern 120a may be parallel with one another. In example embodiments, the (110) plane of the seed pattern 110a, the (110) plane of the interlayer pattern 115a, and the (110) plane of the first perpendicular magnetic pattern 120a may be in alignment with one another. In example embodiments, the (110) plane of the seed pattern 110a, the (110) plane of the interlayer pattern 115a, and the (110) plane of the first perpendicular magnetic pattern 120a may be perpendicular to the major surface of the substrate 100. In example embodiments, a [100] direction of the seed pattern 110a, a [100] direction of the interlayer pattern 115a, and a [100] direction of the first perpendicular magnetic pattern 120a may be parallel with one another.

As shown in FIG. 4C, the third horizontal lattice constant A3T of the interlayer pattern 115a may have a value between the first horizontal lattice constant A1 of the seed pattern 110a and the second horizontal lattice constant A2 of the first perpendicular magnetic pattern 120a. Accordingly, the stress by the difference between the first and the second horizontal lattice constants A1 and A2 may be reduced or minimized. As a result, reliability of the magnetic memory device may be improved.

In the third crystal structure of the interlayer pattern 115a shown in FIG. 4B, an area of the top surface and an area of the bottom surface may be substantially the same. However, the third crystal structure of the interlayer pattern 115a may have a different configuration, which will now be explained with reference to FIG. 4D.

Figure 4D:
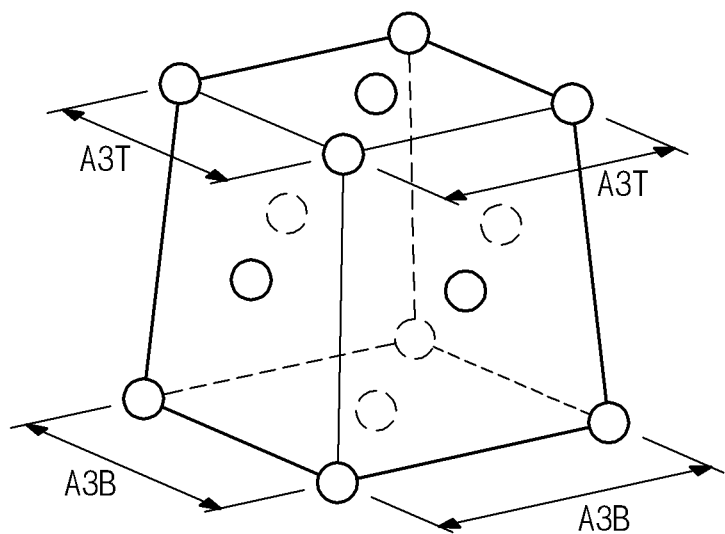
FIG. 4D is a view showing example embodiments of the crystal structure of the interlayer pattern shown in FIG. 4A.

FIG. 4D is a view showing example embodiments of the crystal structure of the interlayer pattern shown in FIG. 4A.

Referring to FIGS. 1 and 4D, the third crystal structure of the interlayer pattern 115a may include a top surface and a bottom surface (both being major surfaces and reversible, the top being the bottom and the bottom being the top). The top surface of the third crystal structure may have a substantially square shape as aforementioned. Also, the bottom surface of the third crystal structure may have a substantially square shape. The top surface and the bottom surface of the third crystal structure may have different surface areas from each other. Specifically, in the third crystal structure, the third horizontal lattice constant A3T of the top surface may be different from a horizontal lattice constant A3B of the bottom surface. In example embodiments, the horizontal constant A3B of the bottom surface of the third crystal structure may have a value between the first horizontal lattice constant A1 (FIG. 2) of the seed pattern 110a and the second horizontal lattice constant A2 (FIG. 3) of the first perpendicular magnetic pattern 120a. When the first horizontal lattice constant A1 (FIG. 2) is greater than the second horizontal lattice constant A2 (FIG. 3), the horizontal lattice constant A3B of the bottom surface may be greater than the third horizontal lattice constant A3T of the top surface and smaller than the first horizontal lattice constant A1 (FIG. 2). However, inventive concepts are not limited thereto. When the first horizontal lattice constant A1 (FIG. 2) is smaller than the second horizontal lattice constant A2 (FIG. 3), the horizontal lattice constant A3B of the bottom surface may be smaller than the third horizontal lattice constant A3T of the top surface and greater than the first horizontal lattice constant A1 (FIG. 2).

The difference in the surface area between the bottom surface and the top surface of the third crystal structure of the interlayer pattern 115a may be generated due to the small thickness of the interlayer pattern 115a and the stress caused by the difference between the first and the second horizontal lattice constants A1 and A2. FIG. 4D shows a distortion of the third crystal structure having the FCC structure of FIG. 4B, which is distorted due to the small thickness of the interlayer pattern 115a and the stress. The third crystal structure may include a distortion of the fluorite structure, the $L1_0$ structure, or the perovskite structure of FIG. 4B, distorted due to the small thickness of the interlayer pattern 115a and the stress. In these cases as well, the bottom surface and the top surface of the third crystal structure may be different from each other.

Figure 4E:
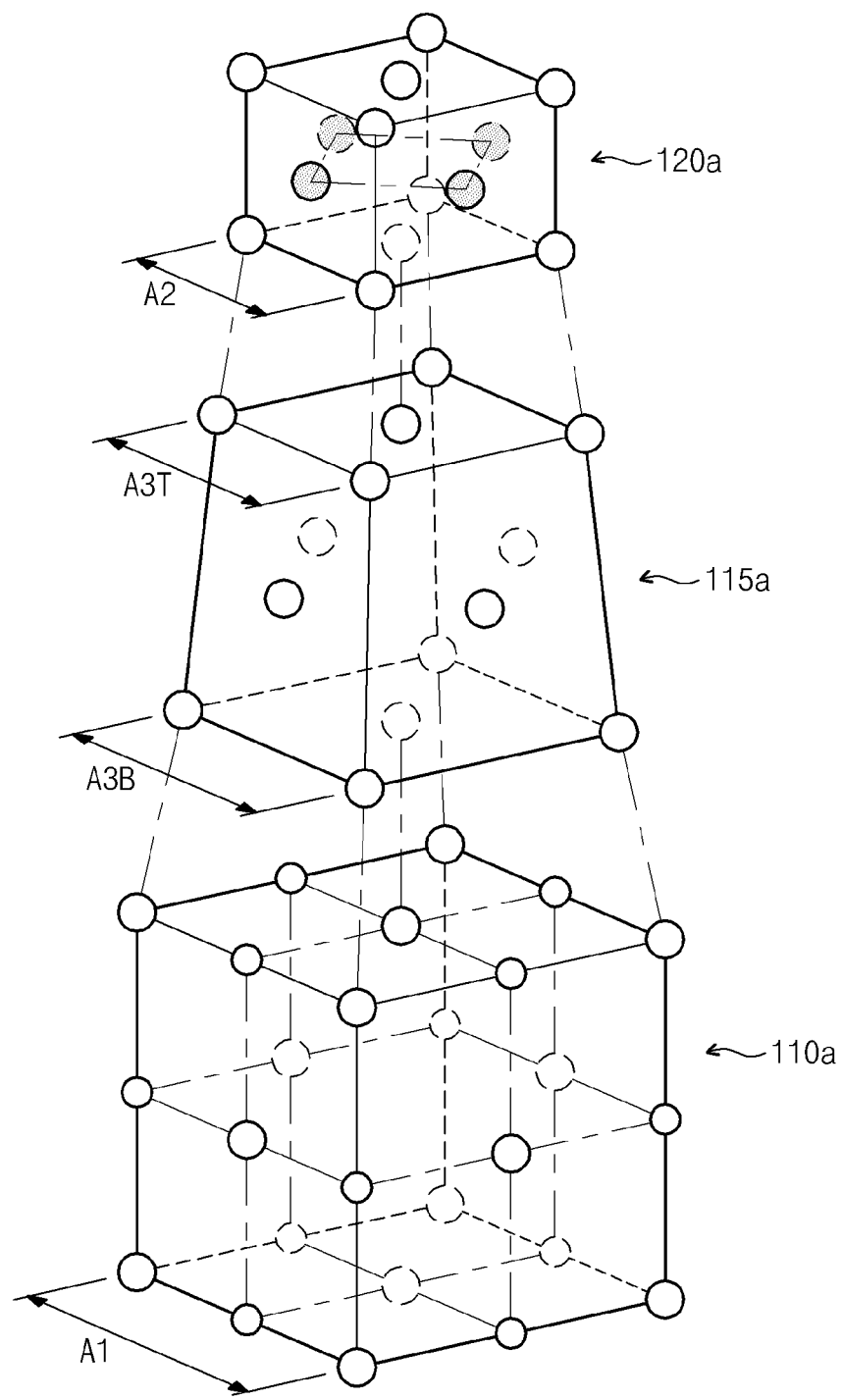
FIG. 4E is a view showing crystal structures of the first perpendicular magnetic pattern and the seed pattern and the crystal structure of the interlayer pattern shown in FIG. 4D.

FIG. 4E is a view showing crystal structures of the first perpendicular magnetic pattern and the seed pattern and the crystal structure of the interlayer pattern shown in FIG. 4D.

Referring to FIGS. 1 and 4E, the third crystal structure of the interlayer pattern 115a shown in FIG. 4D may be disposed between the NaCl structure of the seed pattern 110a and the $L1_0$ structure of the first perpendicular magnetic pattern 120a.

In example embodiments, the (110) plane of the seed pattern 110a, the (110) plane of the interlayer pattern 115a, and the (110) plane of the first perpendicular magnetic pattern 120a may be parallel with one another. In example embodiments, the (110) plane of the seed pattern 110a, the (110) plane of the interlayer pattern 115a, and the (110) plane of the first perpendicular magnetic pattern 120a may be in alignment with one another. In example embodiments, the (110) plane of the seed pattern 110a, the (110) plane of the interlayer pattern 115a, and the (110) plane of the first perpendicular magnetic pattern 120a may be perpendicular to the major surface of the substrate 100.

As shown in FIG. 4E, the first horizontal lattice constant A1 of the seed pattern 110a, the horizontal lattice constant A3B of the bottom surface of the crystal structure of the interlayer pattern 115a, the third horizontal lattice constant A3T of the top surface of the crystal structure of the interlayer pattern 115a, and the second horizontal lattice constant A2 of the first perpendicular magnetic pattern 120a may decrease in sequence. Accordingly, the stress by the difference between the first and the second horizontal lattice constants A1 and A2 may be further reduced. Consequently, the magnetic memory device having a high reliability may be achieved. According to example embodiments, the horizontal lattice constants A1, A3B, A3T, and A2 may sequentially increase.

Next, the third crystal structure of the interlayer pattern 115a according to example embodiments will be described with reference to FIGS. 5A through 5E.

Figure 5A:
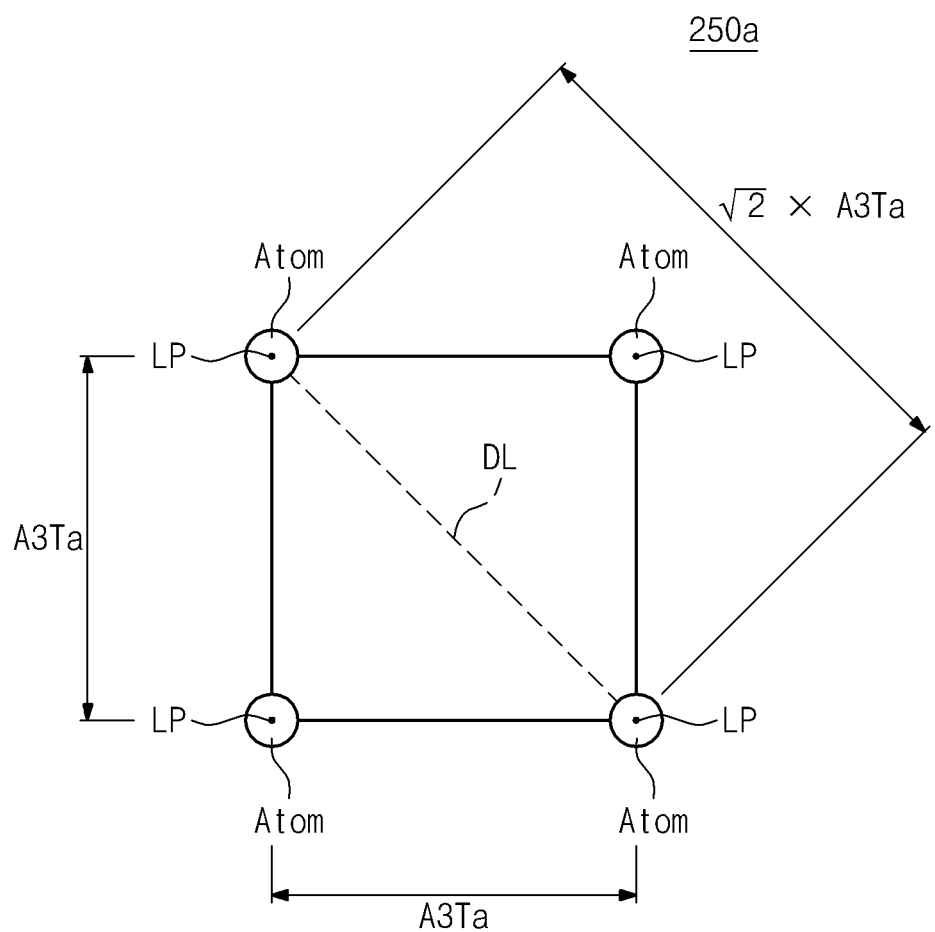
FIG. 5A is a plan view explaining a crystal structure of an interlayer pattern in the magnetic memory device show in FIG. 1, according to example embodiments of inventive concepts.

FIG. 5A is a plan view explaining a crystal structure of an interlayer pattern in the magnetic memory device show in FIG. 1, according to example embodiments of inventive concepts.

Referring to FIGS. 1 and 5A, the third crystal structure of the interlayer pattern 115a may include a top or major surface 250a having a substantially square shape. FIG. 5A is a plan view showing the top surface 250a of the third crystal structure of the interlayer pattern 115a. The top surface 250a of the third crystal structure of the interlayer pattern 115a may correspond to a (001) plane of the third crystal structure. The top surface 250a of the third crystal structure according to the example embodiments may include four lattice points LP corresponding to four vertices of the top surface 250a, respectively. According to example embodiments, a lattice point does not exist at a face center of the top surface 250a of the third crystal structure. Atoms may be disposed at the four lattice points LP, respectively. The top surface 250a includes two horizontal axes and each of the horizontal axes has a third horizontal lattice constant A3Ta. Length of a diagonal line DL of the top surface 250a of the third crystal structure has a value obtained by multiplying the third horizontal lattice constant A3Ta by $\sqrt{2}$.

Referring to FIGS. 1, 2, 3, and 5A, the length of the diagonal line DL of the top surface 250a, that is, the multiplied value of the third horizontal lattice constant A3Ta and $\sqrt{2}$ may have a value between the first horizontal lattice constant A1 of the seed pattern 110a and the second horizontal lattice constant A2 of the first perpendicular magnetic pattern 120a. The diagonal line DL of the top surface 250a may correspond to one of horizontal axes of the $L1_0$ structure of the first perpendicular magnetic pattern 120a. In example embodiments where the first horizontal lattice constant A1 is greater than the second horizontal lattice constant A2, the length of the diagonal line DL of the top surface 250a included in the third crystal structure may be smaller than the first horizontal lattice constant A1 and greater than the second horizontal lattice constant A2. On the other hand, in example embodiments where the first horizontal lattice constant A1 is smaller than the second horizontal lattice constant A2, the length of the diagonal line DL of the top surface 250a may be greater than the first horizontal lattice constant A1 and smaller than the second horizontal lattice constant A2.

Figure 5B:
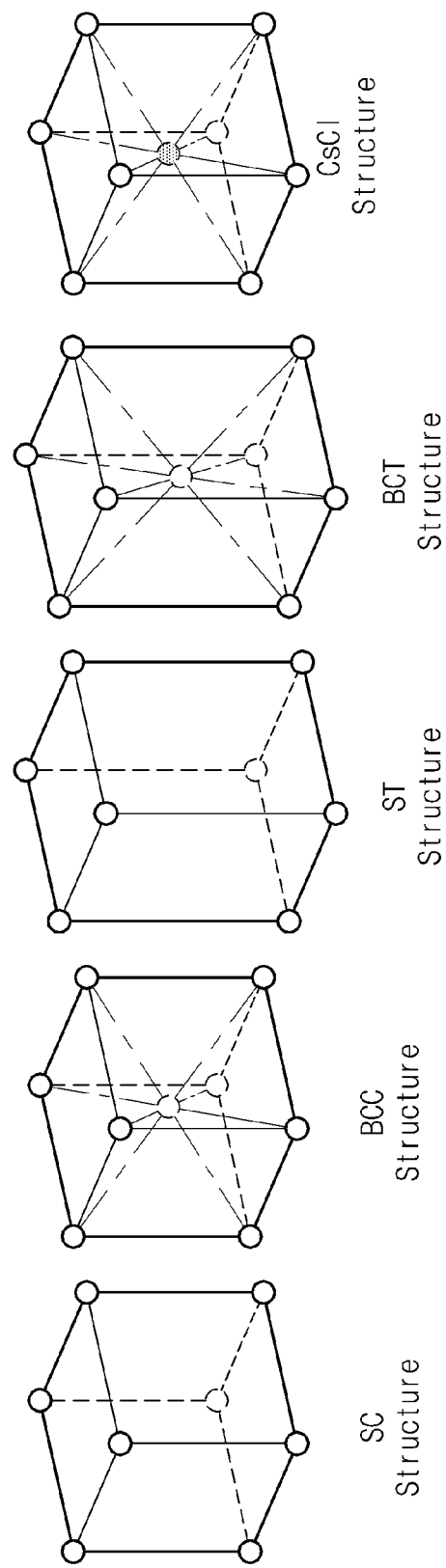
FIG. 5B is a view showing example embodiments of the crystal structure of the interlayer pattern shown in FIG. 5A.

FIG. 5B shows example embodiments of the crystal structure of the interlayer pattern shown in FIG. 5A.

Referring to FIGS. 1, 5A, and 5B, according to example embodiments, the third crystal structure of the interlayer pattern 115a may be one of a simple cubic (SC) structure, a body-centered cubic (BCC) structure, a simple tetragonal (ST) structure, a body-centered tetragonal (BCT) structure, or a cesium chloride (CsCl) structure. In example embodiments where the interlayer pattern 115a may include a single-element material, the third crystal structure of the interlayer pattern 115a may be the SC structure, the BCC structure, the ST structure, or the BCT structure. For example, the interlayer pattern 115a may include the BCC structure including Ta or the BCC structure including Cr. In example embodiments where the interlayer pattern 115a may include a two-element material, the third crystal structure of the interlayer pattern 115a may be the CsCl structure, for example, the CsCl structure including Ru and Al.

According to example embodiments, since the interlayer pattern 115a has a very small thickness, the third crystal structure of the interlayer pattern 115a may be a distortion of an intrinsic crystal structure of a material included in the interlayer pattern 115a, distorted by the seed pattern 110a and the first perpendicular magnetic pattern 120a. For example, Ru atoms, Ti atoms, or Mg atoms may be disposed at the four lattice points LP of the top surface 250a of the third crystal structure shown in FIG. 5A. The intrinsic crystal structure of the Ru, Ti, and Mg may be a hexagonal close-packed structure. However, the intrinsic crystal structure may be distorted due to the difference between the first and the second horizontal lattice constants A1 and A2, such that the third crystal structure having Ru, Ti or Mg may include a the top surface 250a having substantially square shape shown in FIG. 5A. For example, the third crystal structure may include one of the SC structure which has Ru, Ti or Mg, the BCC structure which has Ru, Ti or Mg, the ST structure which has Ru, Ti or Mg, the BCT structure which has Ru, Ti or Mg, of the CsCl structure which has Ru, Ti, and Mg.

As described above, the intrinsic crystal structure of Ru, Ti, or Mg may be distorted to the third crystal structure of FIG. 4A or the crystal structure of FIG. 5A due to the difference between the first and the second horizontal lattice constants A1 and A2.

Figure 5C:
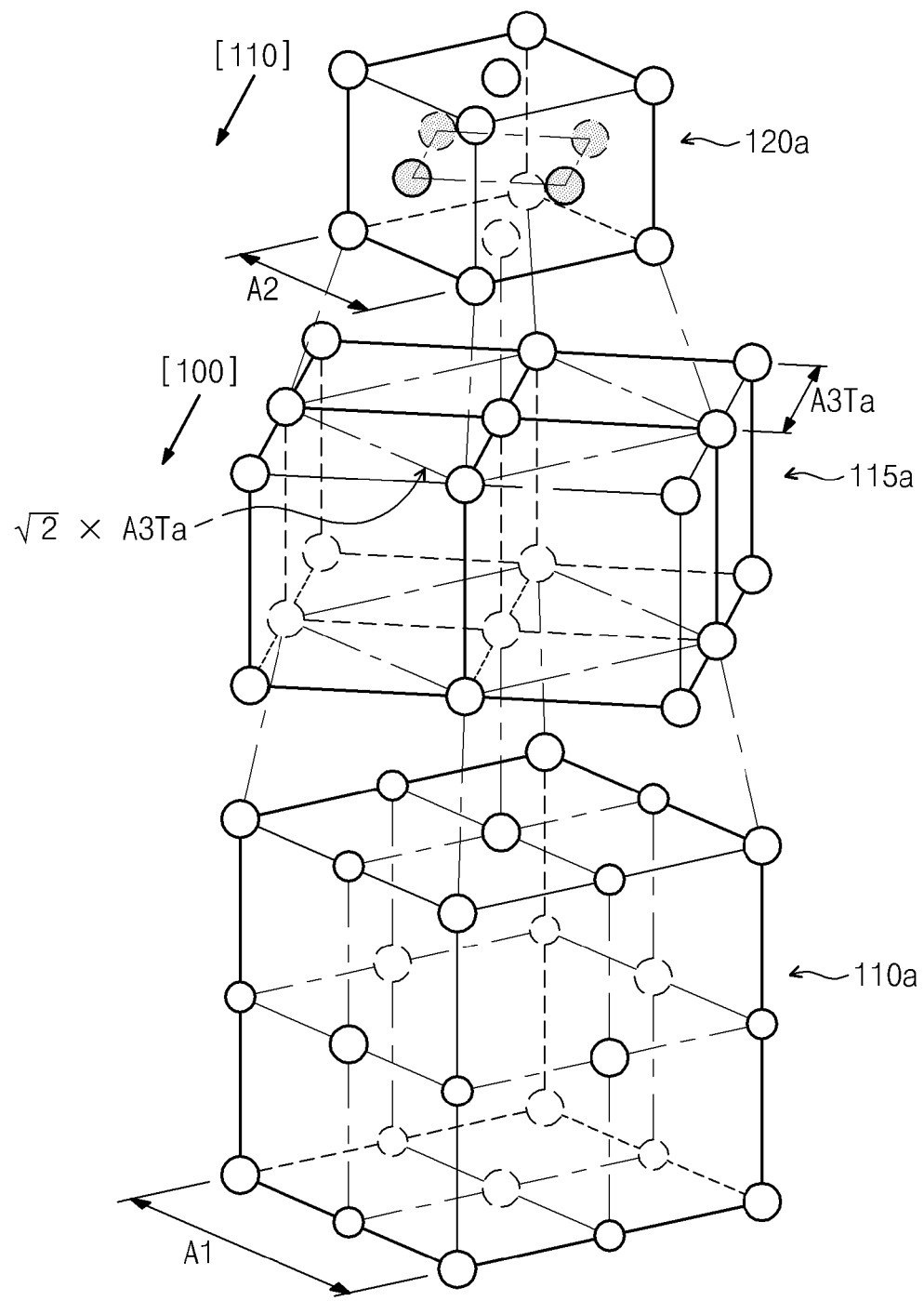
FIG. 5C is a view showing crystal structures of the first perpendicular magnetic pattern and the seed pattern and the crystal structure of the interlayer pattern shown in FIG. 5B.

FIG. 5C shows the crystal structures of the first perpendicular magnetic pattern and the seed pattern and the crystal structure of the interlayer pattern of FIG. 5B.

Referring to FIGS. 1 and 5C, the third crystal structure of the interlayer pattern 115a explained with reference to FIG. 5B may be disposed between the NaCl structure of the seed pattern 110a and the $L1_0$ structure of the first perpendicular magnetic pattern 120a. Here, the diagonal line of the top or major surface of the third crystal structure may correspond to one of the horizontal axes of the $L1_0$ structure of the first perpendicular magnetic pattern 120a. Therefore, as shown in FIG. 5C, four third crystal structures adjacent to one another and arranged in a 2*2 matrix in a plan view may correspond to the $L1_0$ structure of the first perpendicular magnetic pattern 120a. For example, four diagonal lines of the four third crystal structures may correspond to four sides of the (001) plane of the $L1_0$ structure of the first perpendicular magnetic pattern 120a. Therefore, the [100] direction of the third crystal structure may be substantially parallel with a [110] direction of the $L1_0$ structure of the first perpendicular magnetic pattern 120a. In the same manner, a diagonal line of the bottom surface of the third crystal structure may correspond to one of the horizontal axes of the NaCl structure of the seed pattern 110a. The four diagonal lines of the bottom surfaces of the four third crystal structures may correspond to four sides of the (001) plane of the NaCl structure of the seed pattern 110a, respectively. Accordingly, the [110] direction of the NaCl structure may be parallel with the [100] direction of the third crystal structure. The top or major surface of the third crystal structure may be substantially parallel with the top or major surface of the substrate 100.

In example embodiments, the (110) plane of the seed pattern 110a, the (100) plane of the interlayer pattern 115a, and the (110) plane of the first perpendicular magnetic pattern 120a may be parallel with one another. In example embodiments, the (110) plane of the seed pattern 110a, the (100) plane of the interlayer pattern 115a, and the (110) plane of the first perpendicular magnetic pattern 120a may be in alignment with one another. In example embodiments, the (110) plane of the seed pattern 110a, the (100) plane of the interlayer pattern 115a, and the (110) plane of the first perpendicular magnetic pattern 120a may be perpendicular to the major surface of the substrate 100.

Although the SC structure of FIG. 5B is suggested as the third crystal structure of the interlayer pattern 115a in FIG. 5 for convenience of explanation, inventive concepts are not limited thereto. That is, the third crystal structure of the interlayer pattern 115a may be any one of the BCC structure, the ST structure, BCT structure, and the CsCl structure. In addition, FIG. 5C shows the third crystal structure of the interlayer pattern 115a as a single layer for convenience of explanation. However, inventive concepts are not limited thereto. Therefore, the interlayer pattern 115a may include deposition of a plurality of the third crystal structures.

As shown in FIG. 5C, in the interlayer pattern 115a of which the face center of the top or major surface does not have a lattice point, length of the diagonal line of the top surface of the third crystal structure (the multiplied value of the third horizontal lattice constant A3Ta and $\sqrt{2}$) has a value between the first horizontal lattice constant A1 and the second horizontal lattice constant A2. As a result, the stress caused by the difference between the horizontal lattice constants A1 and A2 of the seed pattern 110a and of the first perpendicular magnetic pattern 120a may be reduced or minimized. Consequently, reliability of the magnetic memory device may be improved.

Figure 5D:
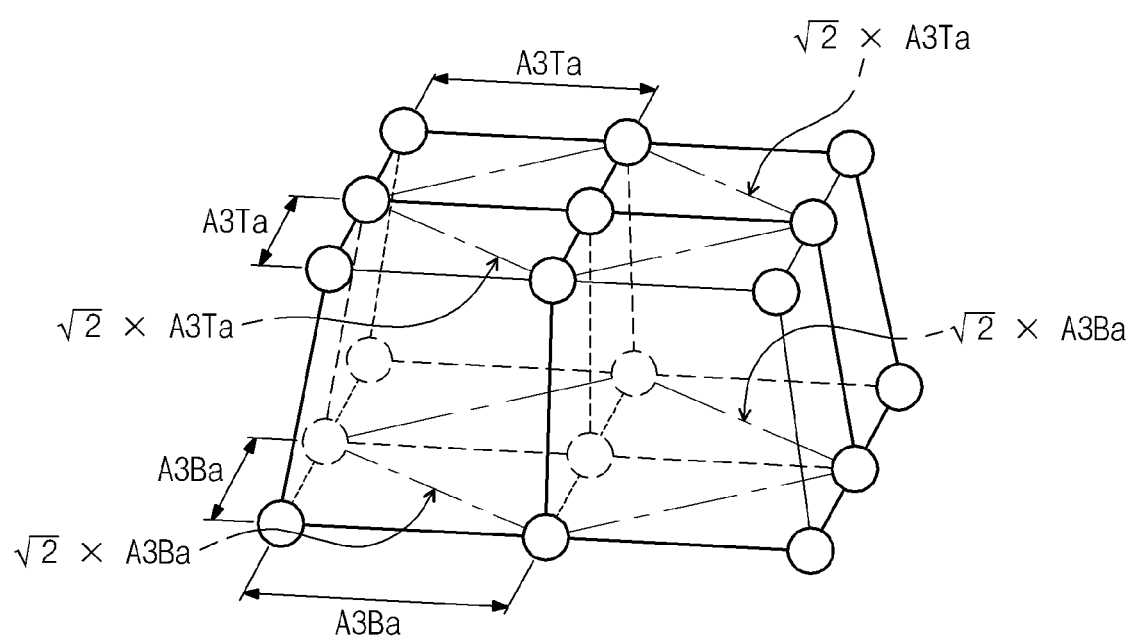
FIG. 5D is a view showing example embodiments of the crystal structure of the interlayer pattern shown in FIG. 5A.

FIG. 5D is a view showing another example of the crystal structure of the interlayer pattern shown in FIG. 5A. FIG. 5D shows the four third crystal structures arranged adjacent to one another in a 2*2 matrix.

Referring to FIGS. 1 and 5D, the third crystal structure of the interlayer pattern 115a may include a top surface having a substantially square shape and a bottom surface having a substantially square shape (both being major surfaces and reversible, the top being the bottom and the bottom being the top). Here, the top surface and the bottom surface of the third crystal structure may have different surfaces areas. In other words, the third horizontal lattice constant A3Ta of the top surface of the third crystal structure may be different from a horizontal lattice constant A3Ba of the bottom surface of the third crystal structure. In example embodiments, the horizontal lattice constant A3Ba of the bottom surface has a value between the first horizontal lattice constant A1 of the seed pattern 110a and the second horizontal lattice constant A2 of the first perpendicular magnetic pattern 120a. When the first horizontal lattice constant A1 is greater than the second horizontal lattice constant A2, the horizontal lattice constant A3Ba of the bottom surface of the third crystal structure may be greater than the third horizontal lattice constant A3Ta of the top surface of the third crystal structure and smaller than the first horizontal lattice constant A1. On the other hand, when the first horizontal lattice constant A1 is smaller than the second horizontal lattice constant A2, the horizontal lattice constant A3Ba of the bottom surface may be smaller than the third horizontal lattice constant A3Ta of the top surface of the third crystal structure and greater than the first horizontal lattice constant A1.

The third crystal structure shown in FIG. 5D is a distortion of the SC structure of FIG. 5B, distorted due to the seed pattern 110a and the first perpendicular magnetic pattern 120a. Alternatively, the third crystal structure may include a distortion of the BCC structure, the ST structure, the BCT structure, or the CsCl structure shown in FIG. 5B, being distorted by the seed pattern 110a and the first perpendicular magnetic pattern 120a. In example embodiments, the bottom surface and the top surface of the third crystal structure may have different surface areas.

Figure 5E:
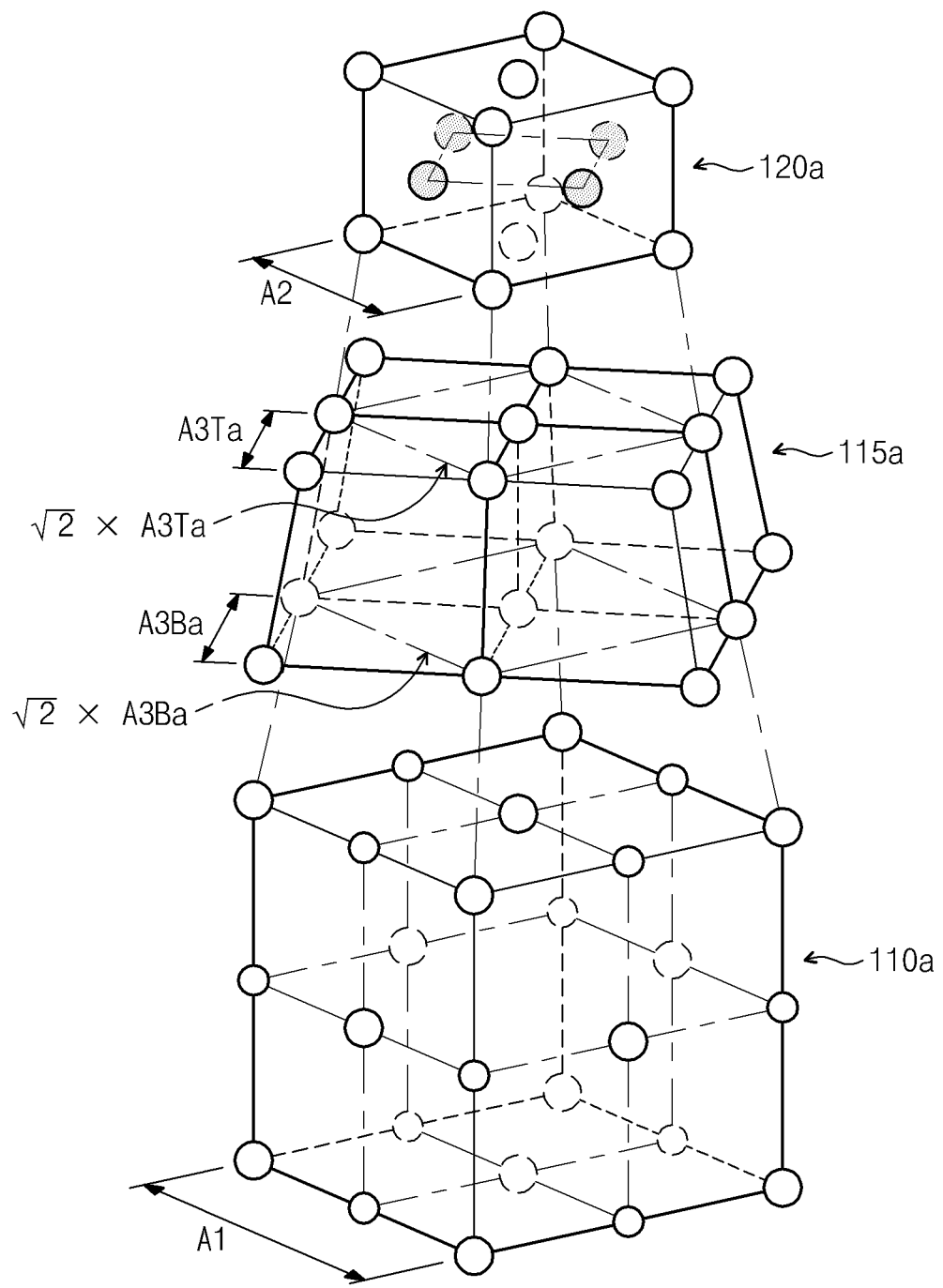
FIG. 5E is a view showing crystal structures of the first perpendicular magnetic pattern and the seed pattern and the crystal structure of the interlayer pattern shown in FIG. 5D.

FIG. 5E shows the crystal structures of the first perpendicular magnetic pattern and the seed pattern and the crystal structure of the interlayer pattern of FIG. 5D.

Referring to FIGS. 1 and 5E, the interlayer pattern 115a shown in FIG. 5E may be disposed between the NaCl structure of the seed pattern 110a and the L1$_0$ structure of the first perpendicular magnetic pattern 120a.

In example embodiments, the (110) plane of the seed pattern 110a, the (100) plane of the interlayer pattern 115a, and the (110) plane of the first perpendicular magnetic pattern 120a may be parallel with one another. In example embodiments, the (110) plane of the seed pattern 110a, the (100) plane of the interlayer pattern 115a, and the (110) plane of the first perpendicular magnetic pattern 120a may be in alignment with one another. In example embodiments, the (110) plane of the seed pattern 110a, the (100) plane of the interlayer pattern 115a, and the (110) plane of the first perpendicular magnetic pattern 120a may be perpendicular to the major surface of the substrate 100. The first horizontal lattice constant A1 of the seed pattern 110a, the horizontal lattice constant A3Ba of the bottom surface of the crystal structure of the interlayer pattern 115a, the third horizontal lattice constant A3Ta of the top or major surface of the crystal structure of the interlayer pattern 115a, and the second horizontal lattice constant A2 of the first perpendicular magnetic pattern 120a may decrease or increased in sequence. Therefore, the interlayer pattern 115a further reduces the stress caused due to the difference between the first and the second horizontal lattice constants A1 and A2, thereby achieving a higher reliability of the magnetic memory device.

Figure 6A:
FIG. 6A is a sectional view explaining an interlayer in the magnetic memory device of FIG. 1, according to example embodiments of inventive concepts.
Figure 6B:
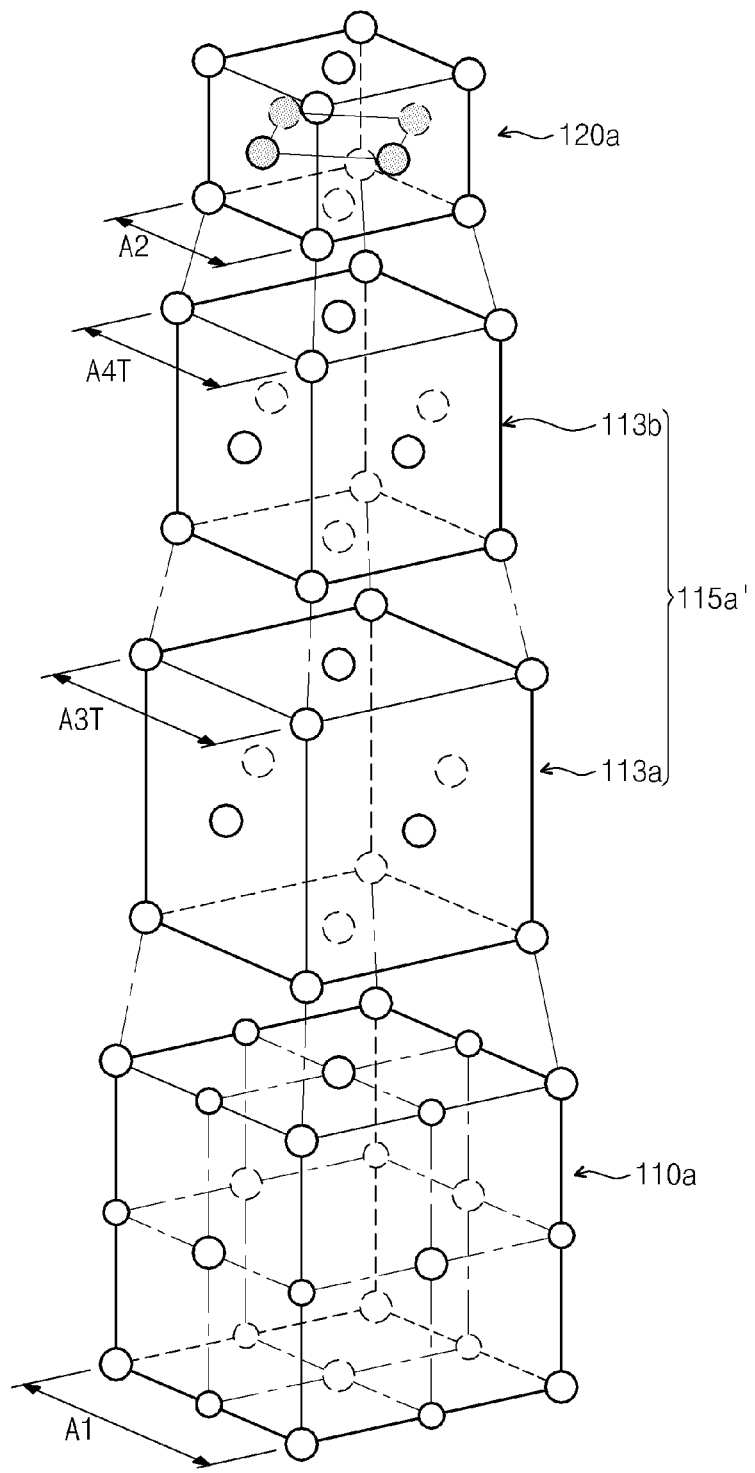
FIG. 6B is a view showing crystal structures of the seed pattern, sub patterns of the interlayer pattern, and the first perpendicular magnetic pattern shown in FIG. 6A according to example embodiments.

FIG. 6A is a sectional view for explaining the interlayer pattern in the magnetic memory device of FIG. 1, according to example embodiments of inventive concepts. FIG. 6B is a view showing crystal structures of the seed pattern, sub patterns of the interlayer pattern, and the first perpendicular magnetic pattern shown in FIG. 6A, according to example embodiments. That is, FIG. 6A enlargingly shows the seed pattern, the interlayer pattern, and the first perpendicular magnetic pattern of FIG. 1 to explain the interlayer pattern of example embodiments.

Referring to FIG. 6A, an interlayer pattern 115a' according to example embodiments may include a first sub pattern 113a and a second sub pattern 113b. The first sub pattern 113a may be disposed between the second sub pattern 113b and the seed pattern 110a. The second sub pattern 113b may be disposed between the first sub pattern 113a and the first perpendicular magnetic pattern 120a.

The first sub pattern 113a may include at least one of the crystal structures explained with FIGS. 4A through 4E or 5A through 5E. The second sub pattern 113b may include a fourth crystal structure. The fourth crystal structure may have the same shape as the third crystal structure but a different horizontal lattice constant from that of the third crystal structure. For example, according to example embodiments, in example embodiments where the first sub pattern 113a includes one of the third crystal structures shown in FIGS. 4A through 4E, a top or major surface of the fourth crystal structure may have a substantially square shape and include five lattice points corresponding to four vertices and a face center of the top surface of the fourth crystal structure. Here, the horizontal lattice constant of the top surface of the fourth crystal structure may be different from the horizontal lattice constant of the top surface of the third crystal structure. This will be more specifically explained with reference to FIG. 6B.

Referring to FIGS. 6A and 6B, the (110) plane of the seed pattern 110a, the (110) plane of the interlayer pattern 115a' (including both the first sub pattern 113a and the second sub pattern 113b), and the (110) plane of the first perpendicular magnetic pattern 120a may be parallel with one another. In example embodiments, the (110) plane of the seed pattern 110a, the (110) plane of the interlayer pattern 115a', and the (110) plane of the first perpendicular magnetic pattern 120a may be in alignment with one another. In example embodiments, the (110) plane of the seed pattern 110a, the (110)

plane of the interlayer pattern 115a', and the (110) plane of the first perpendicular magnetic pattern 120a may be perpendicular to the major surface of the substrate 100.

Further, the top or major surface of the third crystal structure of the first sub pattern 113a has the third horizontal lattice constant A3T and the top surface of the fourth crystal structure of the second sub pattern 113b has a fourth horizontal lattice constant A4T. Here, the fourth horizontal lattice constant A4T may have a value between the third horizontal lattice constant A3T and the second horizontal lattice constant A2 of the first perpendicular magnetic pattern 120a. When the first horizontal lattice constant A1 of the seed pattern 110a is greater than the second horizontal lattice constant A2 of the first perpendicular magnetic pattern 120a, the fourth horizontal lattice constant A4T may be smaller than the third horizontal lattice constant A3T and greater than the second horizontal lattice constant A2. On the other hand, when the first horizontal lattice constant A1 is smaller than the second horizontal lattice constant A2, the fourth horizontal lattice constant A4T may be greater than the third horizontal lattice constant A3T and smaller than the second horizontal lattice constant A2. Thus, since the horizontal lattice constants A3T and A4T of the first and the second sub patterns 113a and 113b of the interlayer pattern 115a' sequentially decrease or increase, the stress caused by the difference between the first and the second horizontal lattice constants A1 and A2 may be further reduced.

According to example embodiments, when the first sub pattern 113a may include one of the third crystal structures shown in FIGS. 5A through 5E, the top or major surface of the fourth crystal structure of the second sub pattern 113b may have a substantially square shape and include four lattice points respectively corresponding to four vertices of the top surface of the fourth crystal structure. Here, the face center of the top surface of the fourth crystal structure does not have a lattice point. In example embodiments, a multiplied value of the horizontal lattice constant of the top surface of the fourth crystal structure and $\sqrt{2}$ may be between a multiplied value of the horizontal lattice constant of the top surface of the first sub pattern 113a and $\sqrt{2}$ and the second horizontal lattice constant of the first perpendicular magnetic pattern 120a. In example embodiments, [100] directions of the third and the fourth crystal structures of the first and the second sub patterns 113a and 113b may be substantially parallel with the [110] directions of first and second crystal structures of the first perpendicular magnetic pattern 120a and the seed pattern 110a.

Referring to FIG. 1, as described above, one of the first and the second perpendicular magnetic patterns 120a and 140a may be the free layer whereas the other may be the reference layer. Each of the first and the second perpendicular magnetic patterns 120a and 140a may have a threshold current. The threshold current means an amount of current required for changing a magnetization direction of a perpendicular magnetic pattern. The threshold currents of the first and the second perpendicular magnetic patterns 120a and 140a may be different from each other. The perpendicular magnetic pattern having a higher threshold current may become the reference layer and the perpendicular magnetic pattern having a lower threshold current may become the free layer. Here, a programming current required for programming the free layer may have a value between the threshold currents of the first and the second perpendicular magnetic patterns 120a and 140a. For example, when the threshold current of the first perpendicular magnetic pattern 120a is lower than the threshold current of the second perpendicular magnetic pattern 140a, the first perpendicular magnetic pattern 120a is the free layer and the second perpendicular magnetic pattern 140a is the reference layer. In example embodiments, the programming current is greater than the threshold current of the first perpendicular magnetic pattern 120a and smaller than the threshold current of the second perpendicular magnetic pattern 140a. The programming current may flow between the seed pattern 110a and the capping electrode 145a. For example, when the programming current may flow in a direction from the seed pattern 110a to the capping electrode 145a and/or from the capping electrode 145a to the seed pattern 110a.

The threshold current may be determined by various factors. For example, the threshold current may increase as thickness of the perpendicular magnetic pattern increases. Also, the threshold current may increase as a magnetic coercivity (Hc) increases. Therefore, among the first and second perpendicular magnetic patterns 120a and 140a, the free layer may have a smaller thickness than the reference layer, and/or, the free layer may have a lower magnetic coercivity than the reference layer.

The second perpendicular magnetic pattern 140a may include a magnetic material having the $L1_0$ structure (for example, ferrum platinum (FePt) having the $L1_0$ structure, cobalt platinum (CoPt) having the $L1_0$ structure, and FePd having the $L1_0$ structure), cobalt ferrum terbium (CoFeTb) in an amorphous state, and/or cobalt ferrum terbium (CoFeGd). Alternatively, the second perpendicular magnetic pattern 140a may have a different configuration, which will now be explained with reference to the drawings.

Figure 7:
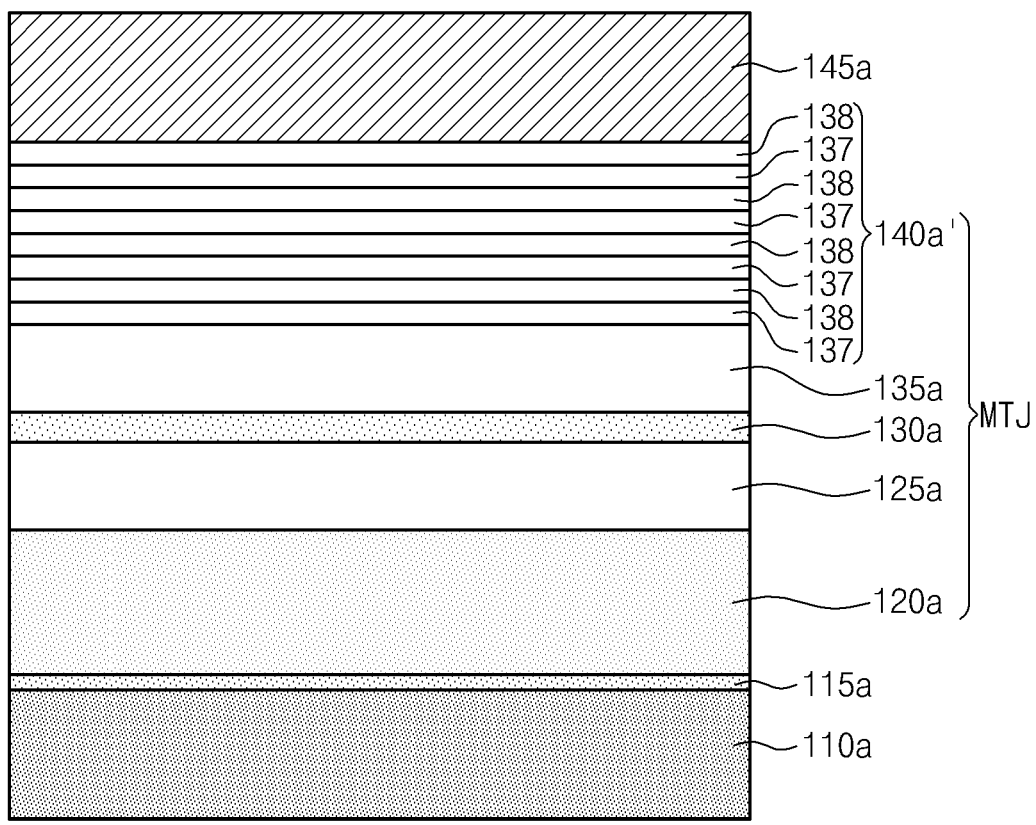
FIG. 7 is a sectional view showing example embodiments of a second perpendicular magnetic pattern in the magnetic memory device of FIG. 1.

FIG. 7 is a sectional view for explaining a modified version of the second perpendicular magnetic pattern in the magnetic memory device of FIG. 1.

Referring to FIG. 7, a second perpendicular magnetic pattern 140a' may include first layers 137 and second layers 138 alternately and repeatedly stacked. Because the first and the second layers 137 and 138 may repeatedly stacked, the second perpendicular magnetic pattern 140a' may have a substantially perpendicular magnetic easy axis at the top surface of the substrate 100. The first layers 137 may include one of Co, CoFe, CoNi, CoCr, or the like. The second layers 138 may include one of Pt, Pd, Ni, or the like. For example, the second perpendicular magnetic pattern 140a' may be in the form of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n (n=the number of deposition).

Referring still to FIG. 1, the tunnel barrier pattern 130a may be formed of a dielectric material, for example, MgO and/or AlO. The tunnel barrier pattern 130a may be in a crystalline state. According to example embodiments, the tunnel barrier pattern 130a may be in a polycrystalline state. The first polarization enhanced pattern 125a and the second polarization enhanced pattern 135a may be adopted to increase a magnetic resistance of the MTJ pattern. The first and the second polarization enhanced patterns 125a and 135a may be formed of a magnetic material, for example, CoFeB or Fe. The first and the second polarization enhanced patterns 125a and 135a may be in a crystalline state, for example, in a polycrystalline state. (001) planes of the first and the second polarization enhanced patterns 125a and 135a may be parallel with a (001) plane of the tunnel barrier pattern 130a. According to example embodiments, the (001) planes of the first and the second polarization enhanced patterns 125a and 135a and of the tunnel barrier pattern 130a may be substantially parallel with the top or major surface of the substrate 100. The first polarization enhanced pattern 125a may be coupled with the first perpendicular magnetic pattern 120a, such that the magnetization direction of the first polarization enhanced pattern 125a may become parallel with the magnetization direction of the first perpendicular magnetic pattern 120a. In the similar manner, the second polarization enhanced pattern 135a may be coupled with the second perpendicular magnetic pattern 140a, such that the magnetization direction of the polarization enhanced pattern 135a may become parallel with the magnetization direction of the second perpendicular magnetic pattern 140a.

The capping electrode 145a may contain a conductive material having a low reactivity. For example, the capping electrode 145a may include a conductive metal nitride such as TiN or TaN. The seed pattern 110a and the capping electrode 145a may be disposed below and on the MTJ pattern, respectively, thereby functioning as a lower electrode and an upper electrode.

A second dielectric layer 150 may be disposed on the overall surface of the substrate 100. An upper contact plug 155 may penetrate the second dielectric layer 150 to be connected with the capping electrode 145a. The second dielectric layer 150 may include oxide, nitride, and/or oxynitride. The upper contact plug 155 may include at least one of metal (ex, Ti, Ta, Cu, Al, or W), a conductive metal nitride (ex, TiN or TaN), or the like. An interconnection 160 may be disposed on the second dielectric layer 150. The interconnection 160 may be connected with the upper contact plug 155. The interconnection 160 may include at least one of metal (ex, T, Ta, Cu, Al, or W), a conductive metal nitride (ex, TiN or TaN), or the like. According to one embodiment, the interconnection 160 may be a bit line.

FIGS. 8A through 8E are sectional views explaining a method of fabricating the magnetic memory device according to example embodiments of inventive concepts.

Figure 8A:
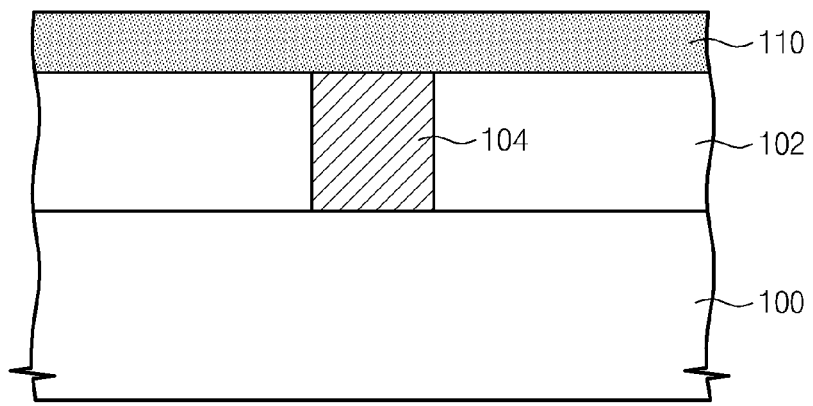
FIGS. 8A through 8E are sectional views explaining a method of manufacturing magnetic memory devices according to example embodiments of inventive concepts.

Referring to FIG. 8A, a first dielectric layer 102 may be formed on a substrate 100 and then a lower contact plug 104 may be formed through the first dielectric layer 102. Next, a seed film or seed layer 110 may be formed on the first dielectric layer 102. The seed film 110 may be formed of a conductive material having a first crystal structure. For example, the seed film 110 may include a conductive metal nitride having an NaCl structure, for example, a TiN film, TaN film, CrN film, and VN film. Here, a (001) plane of the seed film 110 may be substantially parallel with the top surface of the substrate 100. The seed film 110 may be in a polycrystalline state. The seed film 110 may be formed by a sputtering process, a chemical vapor deposition (CVD) process, or an atomic layer deposition (ALD) process.

Figure 8B:
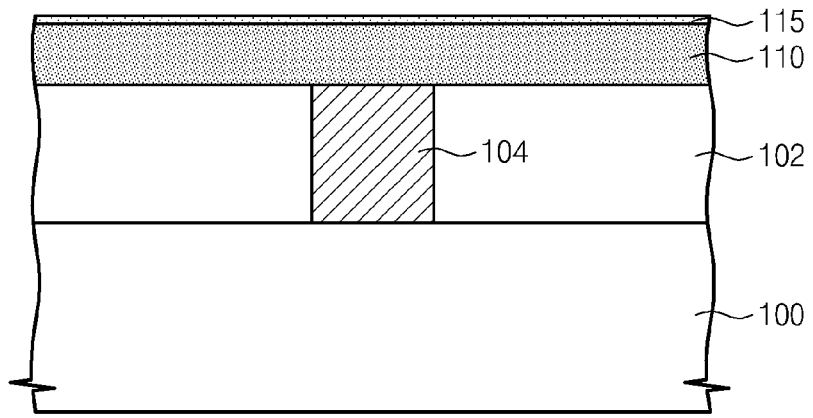

Referring to FIG. 8B, an interlayer film 115 is formed on the seed film 110. The interlayer film 115 may be formed extremely thin, for example, the interlayer film 115 may have a thickness of about 1 to about 10 angstroms. According to example embodiments, the interlayer film 115 may include at least one of Ta, Cr, Pt, Pd, Ti, Ru, Mg, or compounds thereof. The interlayer film 115 may be a single layer or a plurality of sub layers. A [001] direction of the crystal structure of the interlayer film 115 may be substantially perpendicular to the top or major surface of the substrate 100 by the seed layer 110. The interlayer film 115 may be formed by a sputtering process. Alternatively, the interlayer film 115 may be formed by a CVD process, an ALD process, or an epitaxial process.

Figure 8C:
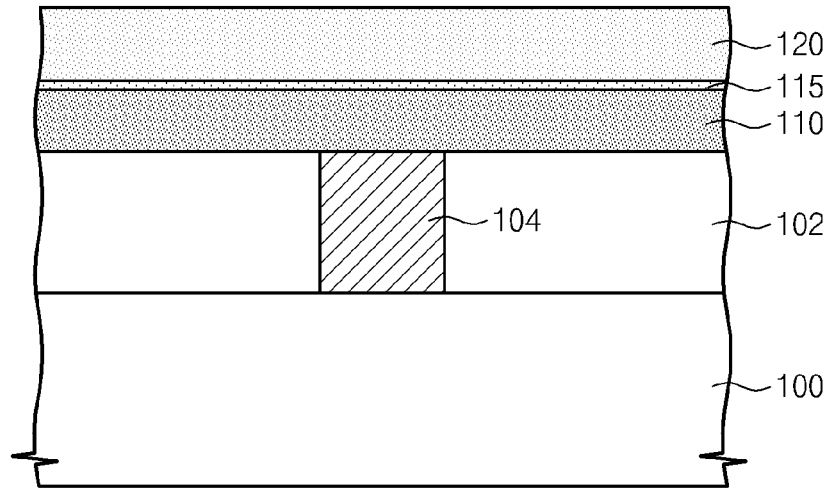

Referring to FIG. 8C, a first perpendicular magnetic film or layer 120 is formed on the interlayer film 115. The first perpendicular magnetic film 120 includes a crystal structure. The first perpendicular magnetic film 120 may include a magnetic material having the $L1_0$ structure. A [001] direction of the $L1_0$ structure of the first perpendicular magnetic film 120 may be substantially perpendicular to the top or major surface of the substrate 100 by the seed layer 110. Since the interlayer film 115 may be extremely thin, the seed film 110 may be able to serve as a seed for growth of the first perpendicular magnetic film 120 in the [001] direction. The first perpendicular magnetic film 120 may be formed by a sputtering process. Alternatively, the first perpendicular magnetic film 120 may be formed by a CVD process, an ALD process, or an epitaxial process.

After the first perpendicular magnetic film 120 is formed, the interlayer film 115 may include at least one of the crystal structures of the interlayer pattern 115a explained with FIGS. 4A through 4E or FIGS. 5A through 5E, or the crystal structures of the interlayer patterns 115a' explained with FIGS. 6A and 6B.

Figure 8D:
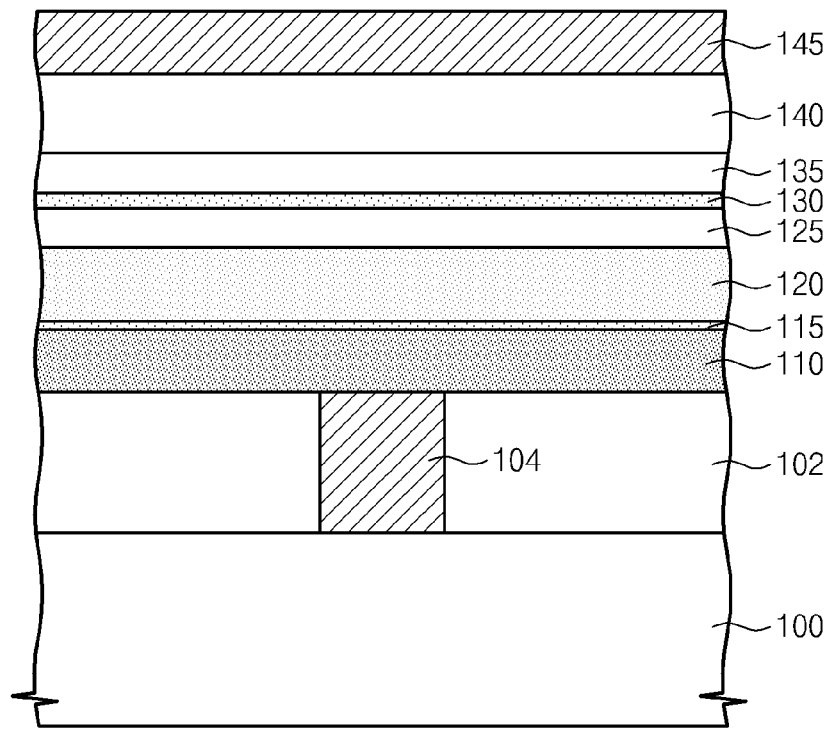

Referring to FIG. 8D, a first polarization enhanced film or layer 125 may be formed on the first perpendicular magnetic film 120. The first polarization enhanced film 125 may be formed by a sputtering process, a CVD process, or an ALD process. The first polarization enhanced film 125 may be formed of a conductive material such as CoFeB and/or Fe. A tunnel barrier film or layer 130 may be formed on the first polarization enhanced film 125. The tunnel barrier film 130 may include a dielectric material such as MgO and/or AlO. The tunnel barrier film 130 may be formed by a sputtering process, a CVD process, or an ALD process. A second polarization enhanced film or layer 135 may be formed on the first tunnel barrier film 130. The second polarization enhanced film 135 may be formed of a conductive material such as CoFeB and/or Fe by a sputtering process, a CVD process, or an ALD process.

A second perpendicular magnetic film or layer 140 may be formed on the second polarization enhanced film 135. The second polarization enhanced film 140 may be in the form of a single layer. Alternatively, as explained with FIG. 7, the second polarization enhanced film 140 may be formed by repeatedly depositing first layers and second layers formed of different materials. A capping electrode film or layer 145 may be formed on the second perpendicular magnetic film 140. The capping electrode film 145 may be formed of a conductive metal nitride and may be formed by a sputtering process, a CVD process, or an ALD process.

Figure 8E:
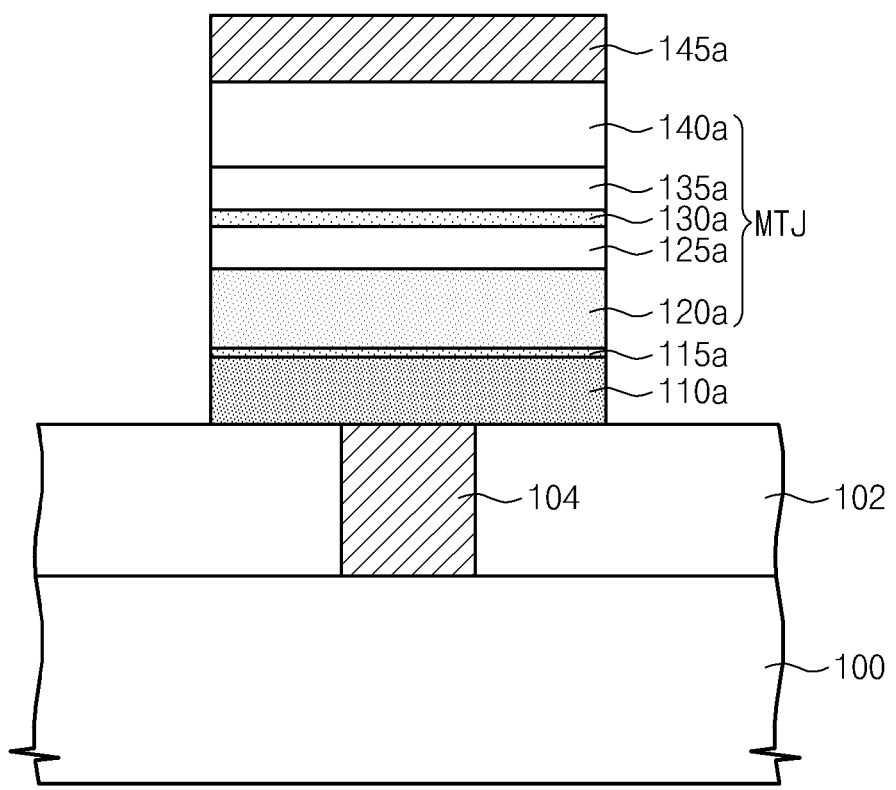

Referring to FIG. 8E, the capping electrode film 145, the second perpendicular magnetic film 140, the second polarization enhanced film 135, the tunnel barrier film 130, the first polarization enhanced film 125, the first perpendicular magnetic film 120, the interlayer film 115, and the seed film 110 are patterned successively. Accordingly, the seed pattern 110a, the interlayer pattern 115a, the first perpendicular magnetic pattern 120a, the first polarization enhanced pattern 125a, the tunnel barrier pattern 130a, the second polarization enhanced pattern 135a, the second perpendicular magnetic pattern 140a, and the capping electrode 145a are sequentially stacked.

Next, the second dielectric layer 150 of FIG. 1 is formed on the overall surface of the substrate 100. In addition, the upper contact plug is formed to pass through the second dielectric layer 150 and the interconnection 160 is formed on the second dielectric layer 150, thus completing the magnetic memory device as shown in FIG. 1.

The magnetic memory devices disclosed in example embodiments may be embodied in the form of various semiconductor packages. The various kinds of packages of the magnetic memory devices may include Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The packages mounting the magnetic memory devices may further include a controller controlling the magnetic memory devices and/or a logic device.

Figure 9:
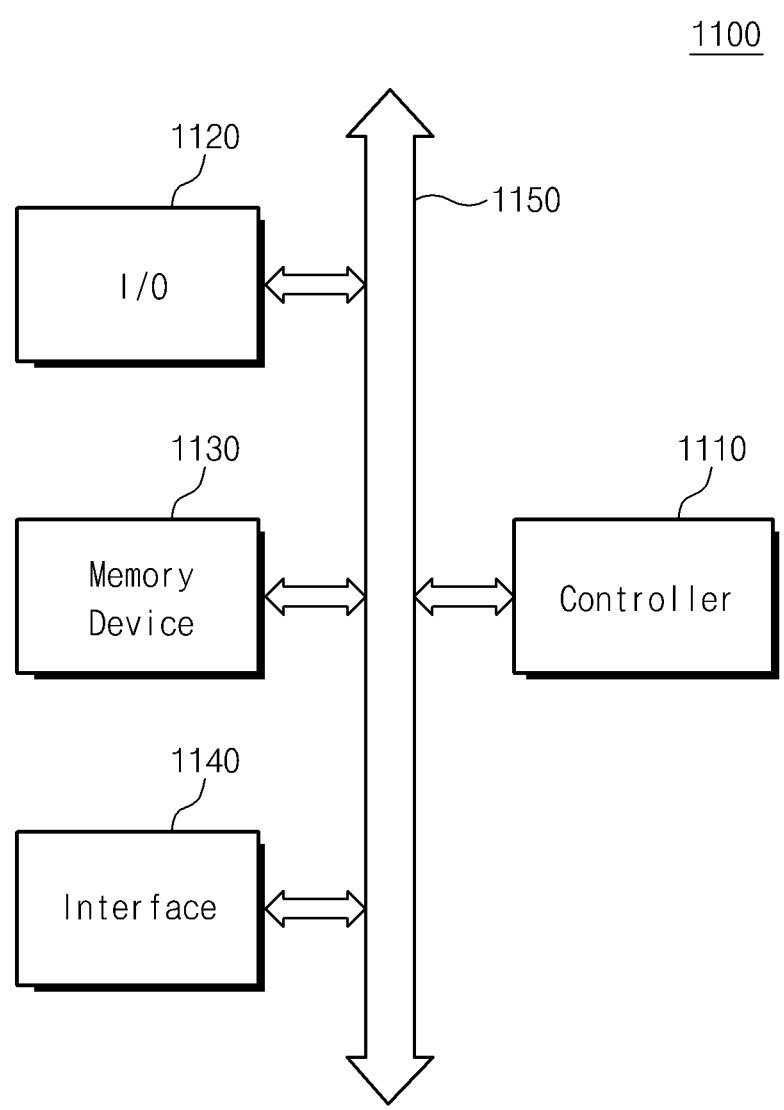
FIG. 9 is a block diagram schematically showing an example electronic system including the magnetic memory device according to example embodiments of inventive concepts.

FIG. 9 is a block diagram schematically showing an example electronic system including the magnetic memory device according to example embodiments of inventive concepts.

Referring to FIG. 9, an electronic system 1100 may include a controller 1110, an input/output device 1120, a memory device 1130, an interface 1140, and a bus 1150. The controller 1110, the input/output device 1120, the memory device 1130, and/or the interface 1140 may be interconnected through the bus 1150. The bus 1150 may function as a path for data transfer.

The controller 1110 may include at least one of a microprocessor, a digital signal processor, a micro controller, or a logic device which performs similar functions to them. The input/output device 1120 may include a keypad, a keyboard, and/or a display device. The memory device 1130 may store data and/or commands. The memory device 1130 may include at least one of the magnetic memory devices introduced in the above-described example embodiments. In addition, the memory device 1130 may further include different types of semiconductor memory devices such as a flash memory device, a phase change memory device, a dynamic random access memory (DRAM), and a static RAM (SRAM). The interface 1140 may transmit and receive data to and from a communication network. The interface 1140 may be wired or wireless. For example, the interface 1140 may include an antenna or a wired or wireless transceiver. Although not shown, the electronic system 1100 may further include a high-speed DRAM and/or SRAM as an operational memory device for improving the operations of the controller 1110.

The electronic system 1100 may be applied to a personal digital assistant (PDA), a portable computer, a web tablet, a wireless phone, a mobile phone, a digital music player, a memory card, and any other electronic products capable of transmitting and receiving data.

Figure 10:
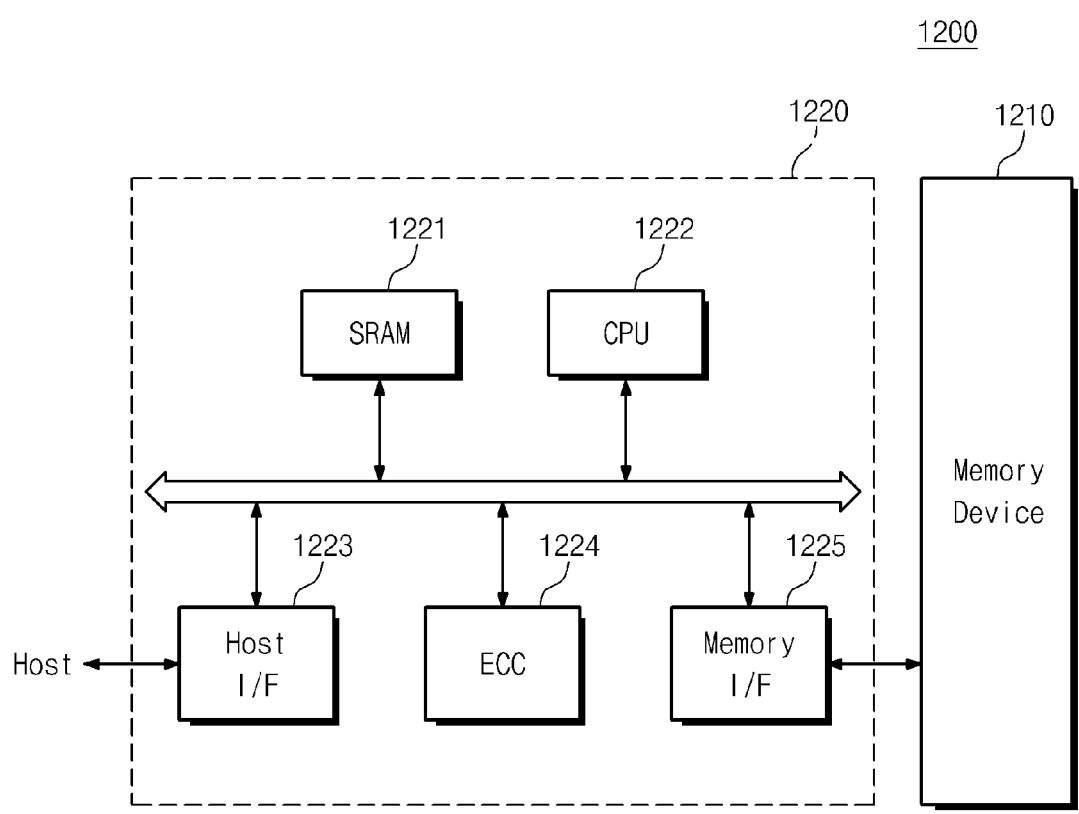
FIG. 10 is a block diagram schematically showing an example memory card including the magnetic memory device according to example embodiments of inventive concepts.

FIG. 10 is a block diagram schematically showing an example memory card including the magnetic memory device according to example embodiments of inventive concepts.

Referring to FIG. 10, a memory card 1200 according to example embodiments of inventive concepts includes a memory device 1210. The memory device 1210 may include at least one of the magnetic memory devices introduced in the above-described embodiments. In addition, the memory device 1210 may further include different types of semiconductor memory devices such as a flash memory device, a phase change memory device, a DRAM, and an SRAM. The memory card 1200 may include a memory controller 1220 which controls data exchange between a host and the memory device 1210.

The memory controller 1220 may include a processing unit 1222 adapted to control the overall operations of the memory card 1200. The memory controller 1220 may include an SRAM 1221 used as an operational memory of the processing unit 1222. Additionally, the memory controller 1220 may further include a host interface 1223 and a memory interface 1225. The host interface 1223 may include a data exchange protocol between the memory card 1200 and the host. The memory interface 1225 may form a connection between the memory controller 1220 and the memory device 1210. Moreover, the memory controller 1220 may further include an error correction (ECC) block 1224 which is adapted to detect and correct errors in data read out from the memory device 1210. Although not shown, the memory card 1200 may further include a read only memory (ROM) device which stores code data for interfacing with the host. The memory card 1200 may be used as a portable data storage card. Alternatively, the memory card 1200 may be used in the form of a solid state disc (SSD) capable of replacing a hard disc of a computer system.

According to example embodiments, an interlayer pattern may be disposed between a seed pattern and a perpendicular magnetic pattern having different horizontal lattice constants. The interlayer pattern may reduce stress between the seed pattern and the perpendicular magnetic pattern caused by the difference in the horizontal lattice constants. Consequently, reliability of the magnetic memory device may be increased.

The above-disclosed subject matter is to be considered illustrative and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A magnetic memory device comprising:
   a seed pattern having a first crystal structure and on a substrate;
   a perpendicular magnetic pattern having a second crystal structure and on the seed pattern; and
   an interlayer pattern having a third crystal structure and between the seed pattern and the perpendicular magnetic pattern,
   wherein a horizontal lattice constant of the first crystal structure is different from a horizontal lattice constant of the second crystal structure, and
   a value obtained by multiplying a horizontal lattice constant of the third crystal structure by $\sqrt{2}$ is between the horizontal lattice constant of the first crystal structure and the horizontal lattice constant of the second crystal structure.

2. The magnetic memory device of claim 1, wherein the seed pattern includes a conductive metal nitride having an NaCl structure, and
   the perpendicular magnetic pattern includes a magnetic material having an $L1_0$ structure.

3. The magnetic memory device of claim 1, wherein the third crystal structure of the interlayer pattern is a distortion of an intrinsic crystal structure of a material comprised in the interlayer pattern.

4. The magnetic memory device of claim 1, wherein a major surface of the third crystal structure has a substantially square shape, and
   the major surface of the third crystal structure includes four lattice points at positions corresponding to four vertices of the major surface of the third crystal structure and no lattice point at a face center thereof.

5. The magnetic memory device of claim 4, wherein the third crystal structure has one of a simple cubic (SC) structure, a body centered cubic (BCC) structure, a simple tetragonal (ST) structure, a body centered tetragonal (BCT) structure, or a cesium chloride (CsCl) structure.

6. The magnetic memory device of claim 4, wherein a [110] direction of the second crystal structure is substantially parallel with a [100] direction of the third crystal structure.

7. The magnetic memory device of claim 4, wherein a bottom surface of the third crystal structure has a substantially square shape;
the bottom surface and the major surface of the third crystal structure have different surface areas from each other,
the horizontal lattice constant of the third crystal structure is a horizontal lattice constant of the major surface of the third crystal structure, and
a value obtained by multiplying a horizontal lattice constant of the bottom surface of the third crystal structure by $\sqrt{2}$ is between the horizontal lattice constant of the first crystal structure and the horizontal lattice constant of the second crystal structure.

8. The magnetic memory device of claim 4, wherein the interlayer pattern includes a first sub pattern and a second sub pattern sequentially stacked;
the first sub pattern has the third crystal structure;
the second sub pattern has a fourth crystal structure;
a major surface of the fourth crystal structure has a substantially square shape,
the major surface of the fourth crystal structure includes four lattice points at positions corresponding to four vertices of the major surface of the fourth crystal structure and no lattice point at a face center thereof, and
a value obtained by multiplying a horizontal lattice constant of the major surface of the fourth crystal structure by $\sqrt{2}$ is between a value obtained by multiplying a horizontal lattice constant of the major surface of the third crystal structure by $\sqrt{2}$, and the horizontal lattice constant of the second crystal structure.

9. A magnetic memory device comprising:
a seed pattern having a first crystal structure and on a substrate;
a perpendicular magnetic pattern having a second crystal structure and on the seed pattern; and
an interlayer pattern having a third crystal structure and between the seed pattern and the perpendicular magnetic pattern,
wherein a horizontal lattice constant of the first crystal structure is different from a horizontal lattice constant of the second crystal structure, and
the third crystal structure includes a horizontal lattice constant having a value between the horizontal lattice constant of the first crystal structure and the horizontal lattice constant of the second crystal structure.

10. The magnetic memory device of claim 9, wherein the seed pattern includes a conductive metal nitride having a sodium chloride (NaCl) structure, and
the perpendicular magnetic pattern includes a magnetic material having an $L1_0$ structure.

11. The magnetic memory device of claim 10, wherein a (001) plane of the first crystal structure and a (001) plane of the second crystal structure are substantially parallel with a major surface of the substrate.

12. The magnetic memory device of claim 9, wherein the third crystal structure of the interlayer pattern is a distortion of an intrinsic crystal structure of a material comprised in the interlayer pattern.

13. The magnetic memory device of claim 9, wherein a major surface of the third crystal structure of the interlayer pattern has a substantially square shape, and the major surface of the third crystal structure includes five lattice points corresponding to four vertices and a face center, respectively, of the major surface of the third crystal structure.

14. The magnetic memory device of claim 13, wherein the third crystal structure has one of a face-centered cubic (FCC) structure, a fluorite structure, an $L1_0$ structure, or a perovskite structure.

15. The magnetic memory device of claim 13, wherein a bottom surface of the third crystal structure has a substantially square shape,
the bottom surface and the major surface of the third crystal structure have different surface areas from each other,
the horizontal lattice constant of the third crystal structure is a horizontal lattice constant of the major surface of the third crystal structure, and
a horizontal lattice constant of the bottom surface of the third crystal structure has a value between the horizontal lattice constant of the first crystal structure and the horizontal lattice constant of the second crystal structure.

16. The magnetic memory device of claim 13, wherein the interlayer pattern includes a first sub pattern and a second sub pattern sequentially stacked;
the first sub pattern has the third crystal structure;
the second sub pattern has a fourth crystal structure;
a major surface of the fourth crystal structure has a substantially square shape and includes five lattice points corresponding to four vertices and a face center, respectively, of the major surface of the fourth crystal structure, and
a horizontal lattice constant of the major surface of the fourth crystal structure has a value between the horizontal lattice constant of the third crystal structure and the horizontal lattice constant of the second crystal structure.

17. The magnetic memory device of claim 9, wherein the interlayer pattern has a thickness of about 1 angstrom to about 10 angstroms.

18. The magnetic memory device of claim 9, wherein a magnetic easy axis of the perpendicular magnetic pattern is substantially perpendicular to a major surface of the substrate.

19. The magnetic memory device of claim 9, wherein the perpendicular magnetic pattern corresponds to a first perpendicular magnetic pattern, the magnetic memory device further comprising:
a tunnel barrier pattern on the first perpendicular magnetic pattern; and
a second perpendicular magnetic pattern on the tunnel barrier pattern,
wherein one of the first perpendicular magnetic pattern and the second perpendicular magnetic pattern is a reference layer having a fixed magnetization direction while the other is a free layer having a variable magnetization direction.

20. A magnetic memory device comprising:
a seed pattern on a substrate with a first atomic plane parallel to a major surface of the substrate, the seed pattern having a first crystal structure and including a nitride;
an interlayer pattern on the seed pattern with the same atomic plane parallel to the first atomic plane of the seed pattern and parallel to the major surface of the substrate, the interlayer pattern having a second crystal structure; and
a perpendicular magnetic pattern on the interlayer pattern with the same atomic plane parallel to the first atomic plane of the seed pattern and to the major surface of the substrate, the perpendicular magnetic pattern having a third crystal structure;

wherein a horizontal lattice constant of the first crystal structure is different from a horizontal lattice constant of the third crystal structure, and the second crystal structure includes a horizontal lattice constant having a value between the horizontal lattice constant of the first crystal structure and the horizontal lattice constant of the third crystal structure.

21. The magnetic memory device of claim 20, wherein the first atomic plane is a (001) plane.

22. The magnetic memory device of claim 21, wherein the seed pattern, the interlayer pattern, and the perpendicular magnetic pattern are grown in a [001] direction to form a magnetic layer of a perpendicular magnetic tunnel junction.

23. The magnetic memory device of claim 22, wherein the [001] direction is parallel to a magnetic easy direction of the perpendicular magnetic tunnel junction.

24. The magnetic memory device of claim 20, wherein the seed pattern includes a conductive metal nitride.

25. The magnetic memory device of claim 24, wherein the nitride is at least one of titanium nitride (TiN), tantalum nitride (TaN), chrome nitride (CrN), or vanadium nitride (VN).

26. The magnetic memory device of claim 20, wherein the seed pattern has a sodium chloride (NaCl) structure.

27. The magnetic memory device of claim 20, wherein the interlayer pattern includes at least one of tantalum (Ta), chromium (Cr), platinum (Pt), palladium (Pd), titanium (Ti), ruthenium (Ru), magnesium (Mg), or compounds thereof.

28. The magnetic memory device of claim 27, wherein the interlayer pattern further includes at least one metal, oxygen (O), or hydrogen (H).

29. The magnetic memory device of claim 20, wherein the interlayer pattern is one of a single-element, two-element, or three-element material.

30. The magnetic memory device of claim 29, wherein the single-element material has a face centered cubic (FCC) structure.

31. The magnetic memory device of claim 29, wherein the two-element material has one of a flourite and an $L1_0$ structure.

32. The magnetic memory device of claim 29, wherein the three-element material has a perovskite structure.

33. The magnetic memory device of claim 29, wherein a bottom surface of the second crystal structure has a substantially square shape, the bottom surface and the major surface of the second crystal structure have different surface areas from each other, the horizontal lattice constant of the second crystal structure is a horizontal lattice constant of the major surface of the second crystal structure, and a horizontal lattice constant of the bottom surface of the second crystal structure has a value between the horizontal lattice constant of the first crystal structure and the horizontal lattice constant of the third crystal structure.

34. The magnetic memory device of claim 29, wherein the interlayer pattern includes a first sub pattern and a second sub pattern sequentially stacked;

the first sub pattern has the second crystal structure;
the second sub pattern has a fourth crystal structure;
a major surface of the fourth crystal structure has a substantially square shape and include five lattice points corresponding to four vertices and a face center of the major surface of the fourth crystal structure, and a horizontal lattice constant of the major surface of the fourth crystal structure has a value between the horizontal lattice constant of the third crystal structure and the horizontal lattice constant of the second crystal structure.

35. The magnetic memory device of claim 20, wherein the perpendicular magnetic pattern includes platinum.

36. The magnetic memory device of claim 35, wherein the perpendicular magnetic pattern includes at least one of $Fe_{50}Pt_{50}$, $Fe_{50}Pd_{50}$, $Co_{50}Pd_{50}$, or $Co_{50}Pt_{50}$.

37. The magnetic memory device of claim 36, wherein the perpendicular magnetic pattern further includes additive materials for improving a degree of crystalline ordering of the perpendicular magnetic pattern.

38. The magnetic memory device of claim 37, wherein the additive materials include at least one of a non-magnetic element, oxide of the non-magnetic element, nitride of the non-magnetic element, silicon oxide, aluminum oxide, or magnesium (Mg) oxide.

39. The magnetic memory device of claim 38, wherein the non-magnetic element includes at least one of boron (B), carbon (C), copper (Cu), silver (Ag), gold (Au), and chromium (Cr).

40. The magnetic memory device of claim 20, wherein the perpendicular magnetic pattern has an $L1_0$ structure.

41. The magnetic memory device of claim 20, wherein the second crystal structure of the interlayer pattern is a distortion of an intrinsic crystal structure of a material comprised in the interlayer pattern.

42. The magnetic memory device of claim 20, wherein a major surface of the second crystal structure of the interlayer pattern has a substantially square shape, and the major surface of the second crystal structure includes five lattice points corresponding to four vertices and a face center, respectively, of the major surface of the second crystal structure.

43. The magnetic memory device of claim 20, wherein the interlayer pattern has a thickness of about 1 angstrom to about 10 angstroms.

44. The magnetic memory device of claim 20, wherein a magnetic easy axis of the perpendicular magnetic pattern is substantially perpendicular to a major surface of the substrate.

45. The magnetic memory device of claim 20, wherein the perpendicular magnetic pattern corresponds to a first perpendicular magnetic pattern, the magnetic memory device further comprising:

a tunnel barrier pattern on the first perpendicular magnetic pattern; and a second perpendicular magnetic pattern on the tunnel barrier pattern, wherein one of the first perpendicular magnetic pattern and the second perpendicular magnetic pattern is a reference layer having a fixed magnetization direction and the other is a free layer having a variable magnetization direction.

46. The magnetic memory device of claim 20, wherein
a value obtained by multiplying a horizontal lattice constant of the second crystal structure by $\sqrt{2}$ is between the horizontal lattice constant of the first crystal structure and the horizontal lattice constant of the third crystal structure.

47. The magnetic memory device of claim 20, wherein the interlayer pattern includes at least one of ruthenium (Ru), magnesium (Mg), titanium (Ti) or compounds thereof.

48. The magnetic memory device of claim 47, wherein the second crystal structure is one of a simple cubic (SC) structure, a body centered cubic (BCC) structure, a simple tetragonal (ST) structure, a body centered tetragonal (BCT) structure, or a cesium chloride (CsCl) structure.

* * * * *